(12) United States Patent
Hirokubo

(10) Patent No.: US 11,347,049 B2
(45) Date of Patent: May 31, 2022

(54) MEMS DRIVING DEVICE, ELECTRONIC APPARATUS, AND MEMS DRIVING METHOD

(71) Applicant: Seiko Epson Corporation, Tokyo (JP)

(72) Inventor: Nozomu Hirokubo, Fujimi (JP)

(73) Assignee: Seiko Epson Corporation

( * ) Notice: Subject to any disclaimer, the term of this patent is extended or adjusted under 35 U.S.C. 154(b) by 285 days.

(21) Appl. No.: 16/420,407

(22) Filed: May 23, 2019

(65) Prior Publication Data

US 2019/0285871 A1 Sep. 19, 2019

Related U.S. Application Data

(63) Continuation of application No. 14/721,175, filed on May 26, 2015, now abandoned.

(30) Foreign Application Priority Data

May 27, 2014 (JP) ................................. 2014-108907

(51) Int. Cl.
*G02B 26/00* (2006.01)
*G01J 3/26* (2006.01)
*B81B 3/00* (2006.01)

(52) U.S. Cl.
CPC .......... *G02B 26/001* (2013.01); *B81B 3/0056* (2013.01); *G01J 3/26* (2013.01)

(58) Field of Classification Search
CPC ........ G02B 26/001; G02B 5/28; G02B 26/02; G02B 26/023; G02B 6/29358; B81B 3/0056; G01J 3/26; G02F 1/21; G02F 1/213; H01L 31/0232
USPC .......................... 359/577, 578; 356/450, 454
See application file for complete search history.

(56) References Cited

U.S. PATENT DOCUMENTS

| | | | | |
|---|---|---|---|---|
| 6,580,516 B1* | 6/2003 | Tucker | ................. | G02B 26/001 356/519 |
| 6,690,178 B2* | 2/2004 | Harris | ................. | G01R 31/2621 324/109 |
| 7,061,660 B1* | 6/2006 | Chen | .................... | G02B 26/001 359/237 |

(Continued)

FOREIGN PATENT DOCUMENTS

| | | |
|---|---|---|
| CN | 102608753 A | 7/2012 |
| JP | 01-094312 A | 4/1989 |

(Continued)

OTHER PUBLICATIONS

JP-2003090967-A, Kitagawa, English Machine Translation (Year: 2003).*

*Primary Examiner* — Marin Pichler
*Assistant Examiner* — Alberto J Betancourt
(74) *Attorney, Agent, or Firm* — Harness, Dickey & Pierce, P.L.C.

(57) ABSTRACT

A spectroscopic measurement apparatus includes a fixed substrate, a movable substrate, and a wavelength variable interference filter which includes an electrostatic actuator for changing the gap dimension between the substrates, a vibration disturbance detection unit which detects vibration added to the wavelength variable interference filter, and a bias driving unit which applies a feed-forward voltage based on a detected value of the vibration disturbance detection unit to the electrostatic actuator.

6 Claims, 12 Drawing Sheets

(56) References Cited

U.S. PATENT DOCUMENTS

| | | | |
|---|---|---|---|
| 2003/0076249 A1* | 4/2003 | Dummermuth | H03M 3/368 |
| | | | 341/110 |
| 2006/0010985 A1 | 1/2006 | Schneider | |
| 2010/0103522 A1 | 4/2010 | Matsumoto | |
| 2012/0120402 A1 | 5/2012 | Hirokubo et al. | |
| 2012/0188552 A1 | 7/2012 | Hirokubo | |
| 2012/0200926 A1 | 8/2012 | Matsushita | |
| 2012/0257205 A1* | 10/2012 | Hirokubo | G01J 3/26 |
| | | | 356/450 |
| 2013/0075596 A1 | 3/2013 | Matsuno et al. | |
| 2013/0308134 A1* | 11/2013 | Hirokubo | G02B 26/001 |
| | | | 356/451 |
| 2014/0029955 A1 | 1/2014 | Schlansker et al. | |
| 2015/0124324 A1 | 5/2015 | Hirokubo et al. | |

FOREIGN PATENT DOCUMENTS

| | | | |
|---|---|---|---|
| JP | 2003-090967 A | | 3/2003 |
| JP | 2003090967 A | * | 3/2003 |
| JP | 2003-215473 A | | 7/2003 |
| JP | 2011-106936 A | | 6/2011 |
| JP | 2012-103604 A | | 5/2012 |
| JP | 2013-238755 A | | 11/2013 |
| WO | WO-2014-053659 A1 | | 4/2014 |

\* cited by examiner

MEMS DRIVING DEVICE, ELECTRONIC APPARATUS, AND MEMS DRIVING METHOD

CROSS-REFERENCE TO RELATED APPLICATIONS

This application is a continuation of U.S. patent application Ser. No. 14/721,175, filed May 26, 2015, which claims priority to Japanese Patent Application No. 2014-108907, filed May 27, 2014, the disclosures of which are hereby expressly incorporated by reference herein in their entireties.

BACKGROUND

1. Technical Field

The present invention relates to an MEMS driving device, an electronic apparatus, and an MEMS driving method.

2. Related Art

In the related art, an apparatus is known which precisely controls the gap dimension between a pair of substrates which face each other (for example, refer to JP-A-1-94312).

The apparatus disclosed in JP-A-1-94312 is an apparatus which controls the gap dimension between a pair of reflection films which are Fabry-Perot etalons (wavelength variable interference filter). In the apparatus, the wavelength variable interference filter includes an electrostatic actuator which controls the gap dimension between substrates, and capacity electrodes which detect the gap dimension between the substrates. In addition, the wavelength variable interference filter includes a control circuit which controls the electrostatic actuator, and an electrostatic capacity detection circuit which detects the electrostatic capacity between the capacity electrodes. Further, the control circuit performs feedback control on a voltage, which is applied to the electrostatic actuator, based on the electrostatic capacity (the gap dimension between the substrates) which is detected by the electrostatic capacity detection circuit.

However, in the apparatus disclosed in JP-A-1-94312, when high frequency vibration (hereinafter, referred to as a disturbance signal) is added from outside, it is difficult to sufficiently cope with the vibration by only performing the feedback control, and thus there is a problem in that the control performance of the gap dimension between the substrates is deteriorated. For example, in the apparatus disclosed in JP-A-1-94312, the feedback control in which the disturbance vibration is taken into consideration, is not performed, with the result that there is a problem in that the substrates diverge and vibrate due to the disturbance vibration when the feedback control is performed, and thus a long amount of time is necessary until the gap dimension between the substrates reaches a desired value.

SUMMARY

An advantage of some aspects of the invention is to provide an MEMS driving device, an electronic apparatus, and an MEMS driving method which are capable of performing driving control with high precision when disturbance vibration is added thereto.

According to an aspect of the invention, there is provided an MEMS driving device including: an MEMS element that includes a pair of substrates and an electrostatic actuator which changes a gap dimension between the pair of substrates; a vibration detection unit that detects vibration which is added to the MEMS element; and an actuator control unit that applies a feed-forward voltage based on a detected value of the vibration detection unit to the electrostatic actuator.

According to the aspect, the vibration detection unit detects disturbance vibration which is added to the MEMS element, and applies the feed-forward voltage to the electrostatic actuator based on the detected value such that the vibration is suppressed. Therefore, it is possible to suppress fluctuation in the gap dimension between the pair of substrates due to the vibration of the MEMS element, and thus it is possible to control the gap dimension between the pair of substrates in the MEMS element with high precision when the disturbance vibration is added thereto.

In the MEMS driving device according to the aspect, the electrostatic actuator may include a bias actuator and a control actuator which is provided independently from the bias actuator, and the actuator control unit may apply the feed-forward voltage to the bias actuator and applies a feed-back voltage based on the gap dimension between the pair of substrates to the control actuator.

According to the aspect, the electrostatic actuator includes the bias actuator and the control actuator, and applies the feed-forward voltage to the bias actuator. Here, the bias actuator is an actuator for coarse adjustment and is used to set the gap dimension between a pair of substrates to a desired value, and the control actuator is an actuator which controls the gap dimension with high precision by applying the feed-back voltage based on the gap dimension. In the electrostatic actuator, the feed-forward voltage is applied to the bias actuator in order to suppress vibration components due to the disturbance vibration or the like which is detected by the vibration detection unit, and thus it is possible to suppress divergence due to the disturbance vibration and to precisely perform gap control when feedback control is performed on the control actuator.

The MEMS driving device according to the aspect may further include a base substrate to which a part of the MEMS element is fixed, and the vibration detection unit may detect vibration of the MEMS element with regard to the base substrate.

According to the aspect, the MEMS element is fixed to the base substrate, and detects the vibration of a MEMS substrate with regard to the base substrate. In this case, in addition to the disturbance vibration, which is added to the MEMS element from the outside, it is possible to detect influence of substrate vibration which is generated when the electrostatic actuator is driven in the MEMS element and to suppress the influence due to the vibration.

In the MEMS driving device according to the aspect, an end of at least one of the pair of substrates may be fixed to the base substrate, and the vibration detection unit may detect vibration at a free end on a side which is opposite to the end of the substrate.

According to the aspect, an end of the substrate of the MEMS element is fixed to the base substrate, and the vibration detection unit detects the vibration of the free end side which is opposite to the fixed end. In this configuration, the vibration of the free end, which is farthest from the fixed part and in which vibration amplitude is large, is detected, and thus it is possible to improve vibration detection precision. In addition, only a part of the substrate of the MEMS element is fixed to the base substrate, and thus it is possible to suppress the deflection of the substrate due to the difference in thermal expansion coefficients between a fixed member, which fixes the substrate and the base substrate, and the substrate.

In the MEMS driving device according to the aspect, at least one of the pair of substrates may include a first electrode which faces the base substrate, the base substrate may include a second electrode which faces the first electrode, and the vibration detection unit may detect the vibration based on an electrostatic capacity between the first electrode and the second electrode.

According to the aspect, the vibration detection unit detects the vibration based on the electrostatic capacity between the first electrode, which is provided on the substrate side of the MEMS element, and the second electrode which is provided on the base substrate. With this configuration, it is possible to simplify a configuration for vibration detection, compared to, for example, a configuration in which vibration is detected using an optical sensor, a gyro sensor, or the like.

In the MEMS driving device according to the aspect, the MEMS element may be a wavelength variable interference filter that includes reflection films which are provided on surfaces of the pair of substrates facing each other, and that selects and emits light having a prescribed wavelength from incident light which is incident to the pair of reflection films facing each other.

According to the aspect, the MEMS element is the wavelength variable interference filter (wavelength variable-side Fabry-Perot etalon) that includes a pair of reflection films and that is capable of changing a gap between the reflection films using the electrostatic actuator. In the wavelength variable interference filter, it is necessary to control the gap dimension between the pair of reflection films (the gap dimension between the pair of substrates) in nanometer order. When being affected by the disturbance vibration, the gap dimension fluctuates, and thus the wavelength of light, which is emitted, easily fluctuates. In contrast, similarly to the above aspect, when the feed-forward voltage based on the vibration, which is detected by the vibration detection unit, is applied to the electrostatic actuator, it is possible to control the gap precision between the reflection films of the wavelength variable interference filter with high precision, and thus it is possible to suppress the fluctuation in the gap dimension due to the disturbance vibration.

According to another aspect of the invention, there is provided an electronic apparatus including: an MEMS driving device including an MEMS element that includes a pair of substrates and an electrostatic actuator which changes a gap dimension between the pair of substrates, a vibration detection unit that detects vibration which is added to the MEMS element, and an actuator control unit that applies a feed-forward voltage based on a detected value of the vibration detection unit to the electrostatic actuator; and a control unit that controls the MEMS driving device.

According to the aspect, the disturbance vibration, which is added to the MEMS element, is detected by the vibration detection unit, and the feed-forward voltage is applied to the electrostatic actuator based on the detected value such that the vibration is suppressed. Therefore, similarly to the above aspect, it is possible to suppress the fluctuation in the gap dimension between the pair of substrates due to the vibration of the MEMS element, and thus it is possible to perform driving control on the MEMS element with high precision when the disturbance vibration is added thereto. Therefore, it is possible to cause the fluctuation in the gap dimension between the pair of substrates to more rapidly converge on the desired value. That is, it is possible to rapidly change the MEMS element to a desired state, and thus it is possible to more rapidly perform a process in the electronic apparatus which includes the MEMS driving device.

In the MEMS driving method according to the aspect, there is provided an MEMS driving method which drives an MEMS element that includes a pair of substrates and an electrostatic actuator which changes a gap dimension between the pair of substrates, the MEMS driving method including: detecting vibration which is added to the MEMS element; and applying a feed-forward voltage based on the detected vibration to the electrostatic actuator.

According to the aspect, the vibration detection unit detects the vibration which is added to the MEMS element, and applies the feed-forward voltage, which is set according to the detected vibration, to the electrostatic actuator. Therefore, similarly to the above-described aspect, it is possible to suppress the disturbance of the driving control in the MEMS driving device due to the vibration, and thus it is possible to realize driving with high precision.

BRIEF DESCRIPTION OF THE DRAWINGS

The invention will be described with reference to the accompanying drawings, wherein like numbers reference like elements.

DESCRIPTION OF EXEMPLARY EMBODIMENTS

First Embodiment

Hereinafter, a first embodiment of the invention will be described with reference to the accompanying drawings.

Configuration of Spectroscopic Measurement Apparatus

Figure 1:
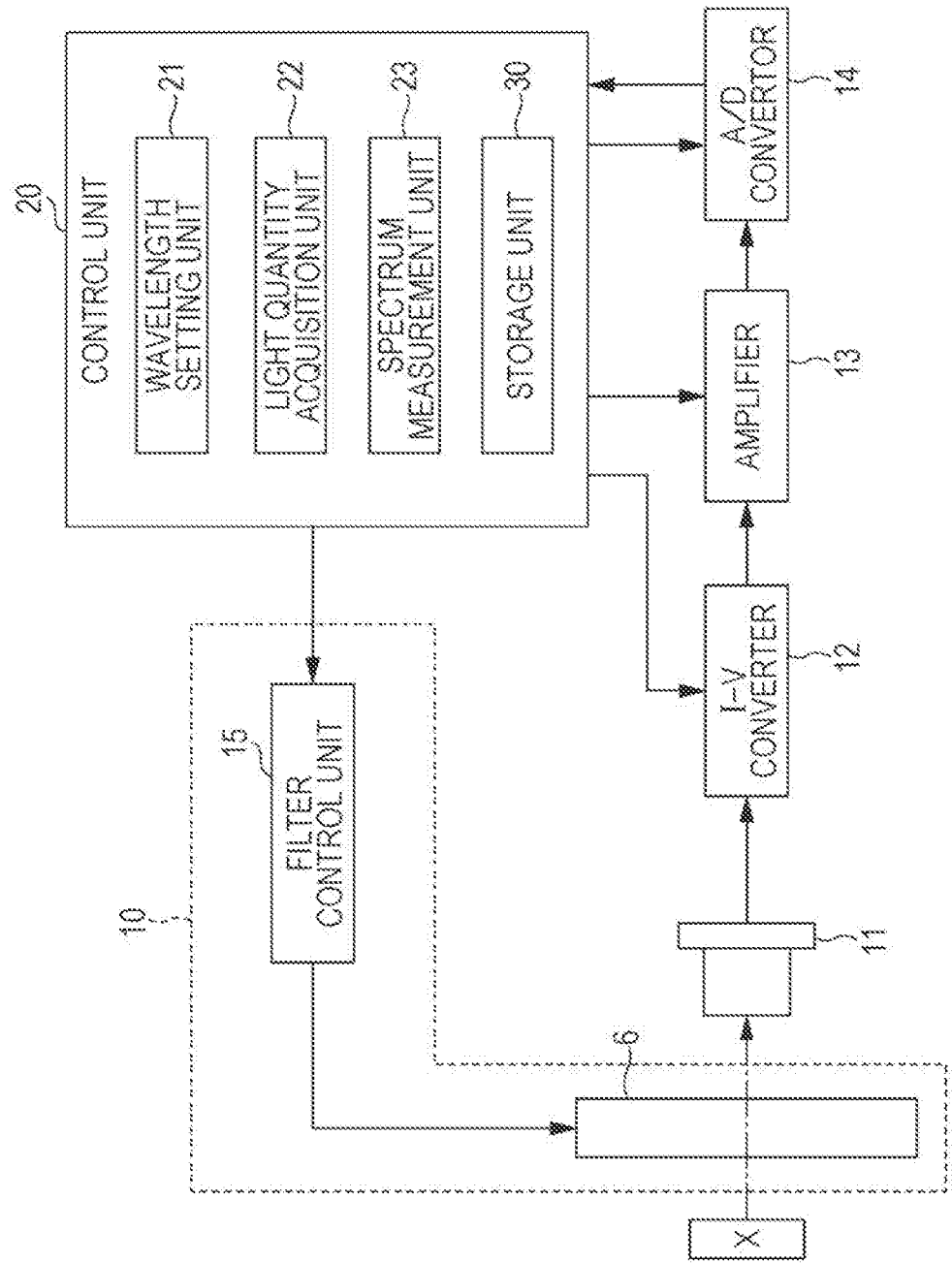
FIG. 1 is a block diagram illustrating the schematic configuration of a spectroscopic measurement apparatus according to a first embodiment of the invention.

FIG. 1 is a block diagram illustrating the schematic configuration of a spectroscopic measurement apparatus according to the first embodiment of the invention.

The spectroscopic measurement apparatus 1 is an apparatus that analyzes light intensity having a prescribed wavelength in measurement target light which is reflected in a measurement target X, and measures an optical spectrum thereof. Meanwhile, in the embodiment, an example is illustrated in which the measurement target light which is reflected in the measurement target X is measured. However, when, for example, a light emitting material, such as a liquid crystal display, is used as the measurement target X, light which is emitted from the light emitting material may be used as the measurement target light.

As illustrated in FIG. 1, the spectroscopic measurement apparatus 1 illustrates an optical module 10 which is an MEMS driving device of the invention, a detector (detection unit), an I-V converter 12, an amplifier 13, an A/D convertor 14, and a control unit 20. In addition, the optical module 10 includes an optical filter device 6 and a filter control unit 15.

The detector 11 receives light which passes through the wavelength variable interference filter 5 of the optical module 10, and outputs a detection signal (current) according to the light intensity of the received light.

The I-V converter 12 converts the detection signal, which is input from the detector 11, into a voltage value, and outputs a voltage to the amplifier 13.

The amplifier 13 amplifies the voltage (detection voltage), which is input from the I-V converter 12, according to the detection signal.

The A/D convertor 14 converts the detection voltage (analog signal), which is input from the amplifier 13, into a digital signal, and outputs the digital signal to the control unit 20.

The filter control unit 15 drives the wavelength variable interference filter 5 under the control of the control unit 20, and transmits light having a prescribed objective wavelength from the wavelength variable interference filter 5.

Configuration of Optical Module

Subsequently, the configuration of the optical module 10 will be described below.

Figure 2:
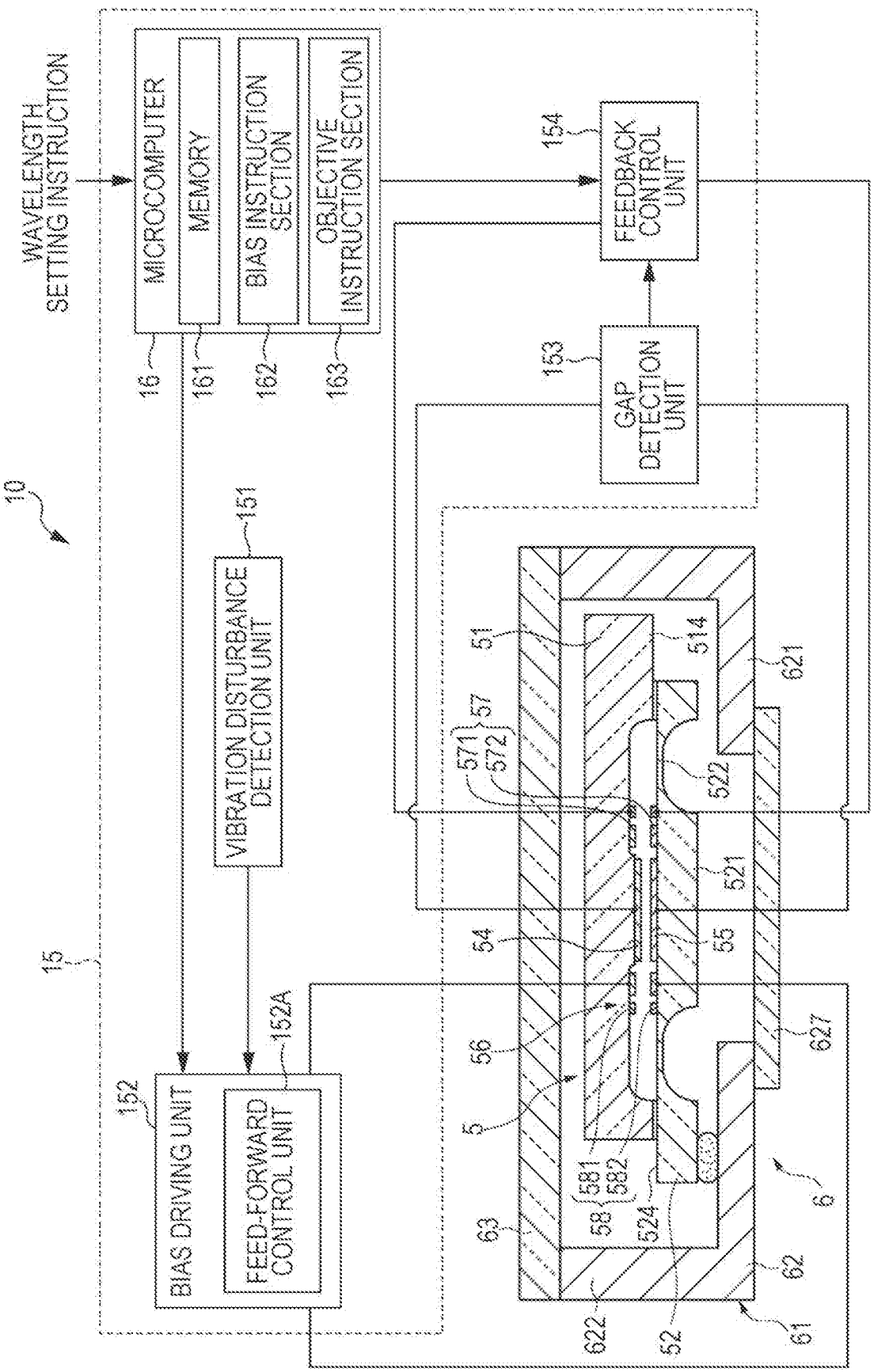
FIG. 2 is a block diagram illustrating the schematic configuration of an optical module according to the first embodiment.

FIG. 2 is a block diagram illustrating the schematic configuration of the optical module 10.

As described above, the optical module 10 includes the optical filter device 6, inside which the wavelength variable interference filter 5 is stored, and the filter control unit 15.

Configuration of Optical Filter Device

Figure 3:
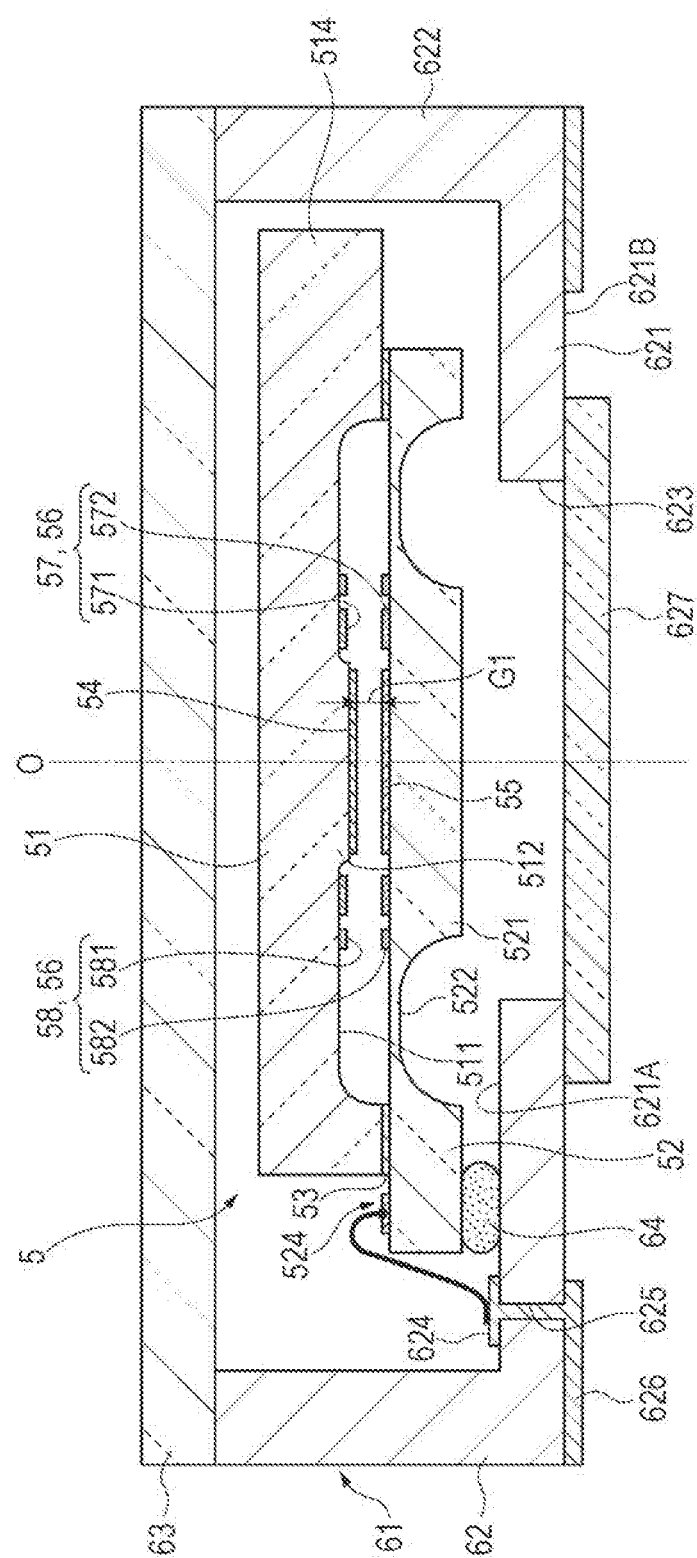
FIG. 3 is a sectional diagram illustrating the schematic configuration of an optical filter device according to the first embodiment.

FIG. 3 is an enlarged sectional diagram in which the optical filter device of FIG. 2 is enlarged. More specifically, FIG. 3 is a sectional diagram illustrating the optical filter device which is cut along the substrate thickness direction (normal directions of reflection films 54 and 55 which will be described later).

The optical filter device 6 is a device which extracts light having the prescribed objective wavelength from incident light and emits the extracted light. As illustrated in FIGS. 2 and 3, the optical filter device 6 includes a housing 61, and the wavelength variable interference filter 5 which is stored inside the housing 61.

Configuration of Wavelength Variable Interference Filter

As illustrated in FIG. 3, the wavelength variable interference filter 5 includes a fixed substrate 51, which is formed of a pair of substrates of the invention, and a movable substrate 52. The fixed substrate 51 and the movable substrate 52 are formed of, for example, various types of glasses, crystals, or the like, respectively. Further, as illustrated in FIG. 3, the substrates 51 and 52 are bonded together by a bonding film 53, thereby being integrally formed.

As illustrated in FIG. 3, the fixed substrate 51 is provided with a fixed reflection film 54 which forms one of a pair of reflection films of the invention. In addition, the movable substrate 52 is provided with a movable reflection film 55 which forms the other one of the pair of reflection films of the invention. The fixed reflection film 54 and movable reflection film 55 are arranged to face each other with a gap G1 therebetween.

Further, the wavelength variable interference filter 5 is provided with an electrostatic actuator 56 which is used to adjust the distance of the gap G1 (gap dimension). The electrostatic actuator 56 includes a bias electrostatic actuator 57 (hereinafter, referred to as a bias actuator 57) and a control electrostatic actuator 58 (hereinafter, referred to as a control actuator 58) which are capable of being independently driven, respectively.

In addition, one end side of the fixed substrate 51 is provided with a protruding part 514 which projects outward compared to the substrate edge of the movable substrate 52. In addition, one end side of the movable substrate 52, which is the opposite side of the protruding part 514 of the fixed substrate 51, includes a protruding part which projects outward compared to the substrate edge of the fixed substrate 51. A surface of the protruding part of the movable substrate 51, which is on the side of the fixed substrate 51, forms an electric part 524.

In the embodiment, an example is shown in which the gap G1 between the reflection films 54 and 55 is formed to be smaller than the gap between the electrodes. However, the gap G1 may be formed to be greater than the gap between the electrodes based on, for example, a wavelength region which is transmitted by the wavelength variable interference filter 5.

Meanwhile, in the description below, a planar view which is viewed from the substrate thickness direction of the fixed substrate 51 and the movable substrate 52, that is, a planar view, in which the wavelength variable interference filter 5 is viewed from the direction of the lamination of the fixed substrate 51, the bonding film 53, and the movable substrate 52, is called a filter planar view. In addition, the central point of the reflection films 54 and 55 is called a central filter point, and the axial line which passes through the central filter point is called a central filter axis O.

Configuration of Fixed Substrate

On the fixed substrate 51, an electrode placement groove 511 and a reflection film installation section 512 are formed through etching. The fixed substrate 51 is formed to have a thicker dimension than the movable substrate 52, and the fixed substrate 51 is not deflected because of the electrostatic attraction force, which is generated when a voltage is applied to the electrostatic actuator 56, or due to the internal stress of the fixed electrode 571, 581.

The electrode placement groove 511 is formed in an annular shape centering on the central filter axis O of the fixed substrate 51 in the filter planar view. The reflection film installation section 512 is formed to project to the side of the movable substrate 52 from the central part of the electrode placement groove 511 in the planar view. Electrodes, which form the electrostatic actuator 56, are placed on the groove bottom surface of the electrode placement groove 511. In addition, the fixed reflection film 54 is placed on the projecting tip surface of the reflection film installation section 512.

On the groove bottom surface of the electrode placement groove 511, a fixed bias electrode 571, which forms the bias actuator 57, and a fixed control electrode 581, which forms the control actuator 58, are placed.

The fixed bias electrode 571 is formed in a substantially arc shape to surround the reflection film installation section 512 in the filter planar view. The fixed bias electrode 571 is wired to the electric part 524 of the movable substrate 52, and is connected to the bias driving unit 152 of the filter control unit 15, which will be described later, from the electric part 524.

The fixed control electrode 581 is formed in a substantially arc shape on the outside of the fixed bias electrode 571 in the filter planar view. The fixed control electrode 581 is wired to the electric part 524 of the movable substrate 52, and is connected to the feedback control unit 154 of the filter control unit 15, which will be described later, from the electric part 524.

The fixed reflection film 54 is formed on the projected end surface of the reflection film installation section 512. For example, it is possible to use a metal film formed of Ag or a conductive alloy film formed of Ag alloy as the fixed reflection film 54. In addition, for example, a dielectric multilayer film, in which a high refractive layer is set to be $TiO_2$ and a low refractive layer is set to be $Si\ O_2$, may be used. In this case, a conductive alloy film is formed on the bottom layer or the surface layer of the dielectric multilayer film, and thus it is possible to cause the fixed reflection film 54 to function as an electrode.

Further, a fixed mirror electrode, which is not shown in the drawing, is connected to the fixed reflection film 54. The fixed mirror electrode is wired to the electric part 524 of the movable substrate 52, and is connected to the gap detection unit 153 of the filter control unit 15, which will be described later, from the electric part 524.

Meanwhile, in the embodiment, an example is shown in which the fixed bias electrode 571, the fixed control electrode 581, and the fixed mirror electrode are independently placed, respectively. However, the invention is not limited thereto. For example, the fixed bias electrode 571, the fixed control electrode 581, and the fixed mirror electrode may be connected to each other as common electrodes. In this case, in the filter control unit 15, the common electrodes are connected to the ground and are set to have equal potential.

Configuration of Movable Substrate

The movable substrate 52 includes a movable part 521 in a circular shape centering on the central filter axis O, and a holding part 522 which has the same axis as the movable part 521 and holds the movable part 521.

The movable part 521 is formed to have a thicker dimension than the holding part 522. The movable part 521 is formed to have a larger diameter dimension than at least the circumferential diameter dimension of the projected end surface of the reflection film installation section 512 in the filter planar view. Further, a movable bias electrode 572, a movable control electrode 582, and a movable reflection film 55 are provided in the movable part 521.

The movable bias electrode 572 faces the fixed bias electrode 571 through a prescribed gap. The movable bias electrode 572 is wired to the electric part 524 of the movable substrate 52, and is connected to the bias driving unit 152 of the filter control unit 15, which will be described later, from the electric part 524.

The movable control electrode 582 faces the fixed control electrode 581 through the prescribed gap. The movable control electrode 582 is wired to the electric part 524 of the movable substrate 52, and is connected to the feedback control unit 154 of the filter control unit 15, which will be described later, from the electric part 524.

The movable reflection film 55 is provided to face the fixed reflection film 54 through the gap G1 on the surface of the movable part 521 which faces the fixed substrate 51. A reflection film, which has the same configuration as the above-described fixed reflection film 54, is used as the movable reflection film 55.

Further, a fixed mirror electrode, which is not shown in the drawing, is connected to the movable reflection film 55. The movable mirror electrode is wired to the electric part 524 of the movable substrate 52, and is connected to the gap detection unit 153 of the filter control unit 15, which will be described later, from the electric part 524.

The holding part 522 is a diaphragm which surrounds the periphery of the movable part 521, and is formed to have a smaller thickness dimension than the movable part 521. The holding part 522 is more easily deflected compared to the movable part 521, and thus it is possible to displace the movable part 521 to the side of the fixed substrate 51 due to slight electrostatic attraction force. Here, the movable part 521 has the larger thickness dimension and is harder than the holding part 522. Therefore, when the holding part 522 is pulled to the side of the fixed substrate 51 due to the electrostatic attraction force, the shape of the movable part 521 is not changed. Therefore, the movable reflection film 55, which is provided at the movable part 521, is not deflected, and thus it is usually possible to maintain the fixed reflection film 54 and the movable reflection film 55 in a parallel state.

Meanwhile, in the embodiment, the holding part 522 in the diaphragm-shape is described as an example. However, the invention is not limited thereto. For example, a beam-shaped holding part, which is placed at an equal angle interval centering on the central filter axis O, may be provided.

Configuration of Housing

The configuration of the housing 61 of the optical filter device 6 will be described in detail.

As illustrated in FIG. 3, the housing 61 includes a base 62 (base substrate) and a lid 63. With regard to the base 62 and the lid 63, it is possible to use, for example, low melting point glass bonding using glass frit (low-melting point glass), which is pieces of glass acquired by melting a glass material at high temperature and rapidly cooling the glass material, bonding using epoxy resin, or the like. Therefore, accommodation space is formed inside, and the wavelength variable interference filter 5 is stored in the accommodation space.

Configuration of Base

The base 62 is formed by laminating, for example, thin plate shape ceramics, and includes a pedestal part 621 and a side wall part 622.

The pedestal part 621 is formed in, for example, a flat plate shape which has a rectangular outer shape in the filter planar view. The side wall part 622, which has a cylindrical shape, rises toward the lid 63 from the periphery of the pedestal part 621. Meanwhile, in the embodiment, since the pedestal part 621 has a rectangular flat plate shape, an example is shown in which the side wall part 622 is formed in a square cylindrical shape. However, the side wall part 622 may be formed in, for example, a cylindrical shape.

The pedestal part 621 includes a light passage hole 623 which passes therethrough in the thickness direction. The light passage hole 623 is provided to include an area which overlaps with the reflection films 54 and 55 in a state in which the wavelength variable interference filter 5 is accommodated in the pedestal part 621 in the planar view in which the pedestal part 621 is viewed from the thickness direction.

In addition, a cover glass 627, which is a light transmitting member of the invention for covering the light passage hole 623, is bonded to the surface (outward base surface 621B) of the pedestal part 621 which is on a side opposite to the lid 63.

It is possible to bond the pedestal part 621 to the cover glass 627 using, for example, the low melting point glass bonding, bonding using an adhesive, or the like. In the embodiment, in a state in which inside of the accommodation space is maintained under decompression, an air-tight state is maintained. Therefore, it is preferable that the pedestal part 621 be bonded to the cover glass 627 using the low melting point glass bonding.

In addition, on the inner surface of the pedestal part 621 which faces the lid 63 (base inner surface 621A), the respective electrodes (the fixed bias electrode 571, the movable bias electrode 572, the fixed control electrode 581, and the movable control electrode 582), which are drawn to the electric part 524 of the wavelength variable interference filter 5, and an inner terminal part 624, which is connected to the respective mirror electrodes connected to the respective reflection films 54 and 55, are provided. The inner terminal part 624 is connected to the electrodes using, for example, a wire formed of Au through wire bonding. Meanwhile, in the embodiment, the wire bonding is described as an example. However, for example, Flexible Printed Circuits (FPC) or the like may be used.

In addition, a conductive hole 625 is formed in a location, in which the inner terminal part 624 is provided, at the pedestal part 621. The inner terminal part 624 is connected to an outward terminal part 626, which is provided on the outward base surface 621B of the pedestal part 621, through the conductive hole 625. The outward terminal part 626 is electrically connected to the filter control unit 15.

The side wall part 622 rises from the edge of the pedestal part 621, and covers the periphery of the wavelength variable interference filter 5 which is mounted on an inner base surface 621A. A surface of the side wall part 622, which faces the lid 63 is, for example, a flat surface which is parallel to the inner base surface 621A.

Further, the wavelength variable interference filter 5 is fixed to the base 62 using, for example, a fixing member 64 such as an adhesive. Here, the wavelength variable interference filter 5 may be fixed to the pedestal part 621 or may be fixed to the side wall part 622. A location, in which the fixing member 64 is provided, may include a plurality of places. However, in order to suppress the stress of the fixing member 64 from being transmitted to the wavelength variable interference filter 5, it is preferable that the wavelength variable interference filter 5 is fixed in a single place. In the embodiment, an example is shown in which a part of the surface of the movable substrate 52, which is on a side opposite to the fixed substrate 51, is fixed to the pedestal part 621 on the side of the electric part 524 of the movable substrate 52, as illustrated in FIG. 3.

Configuration of Lid

The lid 63 is a flat glass plate, and is bonded to the cross section of the side wall part 622 of the base 62. As described above, it is possible to use the low melting point glass bonding or the like as a method of bonding the lid 63 to the base 62.

Configuration of Filter Control Unit

As illustrated in FIG. 2, the filter control unit includes the vibration disturbance detection unit 151, the bias driving unit 152, the gap detection unit 153, the feedback control unit 154, and the micro-computer (micro-controller) 16.

The vibration disturbance detection unit 151 is a vibration detection unit of the invention, and detects the disturbance vibration, which is added to the optical filter device 6, from the outside. More specifically, the vibration disturbance detection unit 151 is formed of, for example, various types of sensors such as a gyro sensor and an acceleration sensor, and detects the disturbance vibration, which is added to the optical filter device 6, from the quantity of a state, such as acceleration, which is detected by the sensors. In addition, the vibration disturbance detection unit 151 outputs the detected value of the detected disturbance vibration to the bias driving unit 152.

When the control actuator 58 performs control, the bias driving unit 152 applies a bias voltage to the bias actuator 57 such that sensitivity becomes uniform. In addition, the bias driving unit 152 is formed to include a feed-forward control unit 152A, and applies the bias voltage such that the disturbance vibration is offset according to the disturbance vibration, which is added to the optical filter device 6. That is, the bias driving unit 152 forms an actuator control unit in the invention. More specifically, the feed-forward control unit 152A adjusts the bias voltage by adding or subtracting a prescribed value based on the detected value of the disturbance vibration, which is input from the vibration disturbance detection unit 151, to or from a bias instruction value which is input from the micro-computer 16.

The gap detection unit 153 detects the dimension of the gap G1 from the electrostatic capacity between the reflection films 54 and 55, and outputs a detection signal to the feedback control unit 154. More specifically, the gap detection unit 153 includes a C-V converting circuit, which is not shown in the drawing, and converts the electrostatic capacity between the reflection films 54 and 55 into a voltage value (detection signal). For example, a switched capacitor circuit or the like may be provided as an example of the C-V converting circuit.

Meanwhile, the gap detection unit 153 may output an analog signal or a digital signal as the detection signal. When the digital signal is output, the detection signal (analog signal) from the C-V converting circuit is input to an Analog to Digital Converter (ADC) and is converted into a digital value.

The feedback control unit 154 applies the feed-back voltage to the control actuator 58 based on an instruction signal, in which the gap G1 input from the micro-computer 16 is set to a prescribed objective value, and the detected value which is input from the gap detection unit 153.

The micro-computer 16 includes a memory 161, and stores, for example, the relationship (gap correlative data) between the detection signal (voltage signal), which is detected by the gap detection unit 153, and the dimension of the gap G1.

In addition, as illustrated in FIG. 2, the micro-computer 16 functions as a bias instruction section 162 and an objective instruction section 163.

When a wavelength setting instruction is input from the control unit 20, the bias instruction section 162 calculates the bias voltage corresponding to an objective wavelength, and outputs the bias voltage to the bias driving unit 152.

When the wavelength setting instruction is input from the control unit 20, the objective instruction section 163 calculates the dimension of the gap G1 (objective value) corresponding to the objective wavelength, and outputs the dimension of the gap G1 to the feedback control unit 154 as an objective signal.

Configuration of Control Unit

Returning to FIG. 1, the control unit 20 of the spectroscopic measurement apparatus 1 will be described.

The control unit 20 corresponds to the processing unit of the invention, is configured in a manner in which, for example, a CPU, a memory, and the like are combined, and controls the entire operation of the spectroscopic measurement apparatus 1. As illustrated in FIG. 1, the control unit 20 includes a wavelength setting unit 21, a light quantity acquisition unit 22, a spectrum measurement unit 23, and a storage unit 30.

The storage unit 30 stores various types of programs for controlling the spectroscopic measurement apparatus 1, and various types of data (for example, V-λ data which indicates a driving voltage for an objective wavelength).

The wavelength setting unit 21 sets the objective wavelength of light which is extracted by the wavelength variable interference filter 5, and outputs a control signal, which indicates that the set objective wavelength is extracted from the wavelength variable interference filter 5, to the filter control unit 15.

The light quantity acquisition unit 22 acquires the quantity of light, which passes through the wavelength variable interference filter 5 and which has the objective wavelength, based on the quantity of light which is acquired by the detector 11.

The spectrum measurement unit 23 measures the spectral characteristics of the measurement target light based on the quantity of light which is acquired by the light quantity acquisition unit 22.

Method for Driving Wavelength Variable Interference Filter

Figure 4:
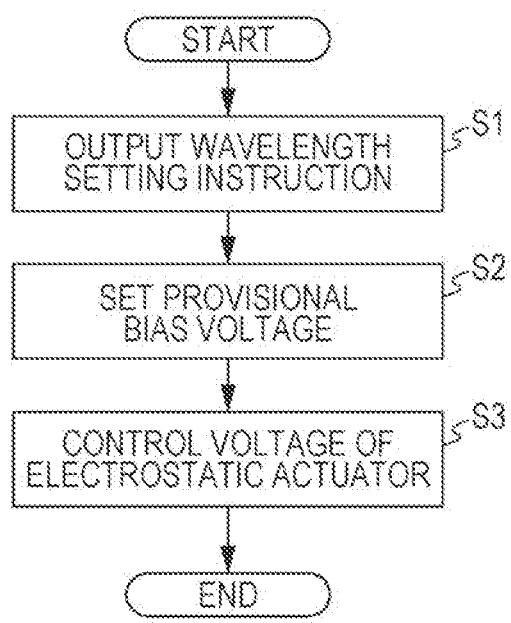
FIG. 4 is a flowchart illustrating a method of driving the optical module according to the first embodiment.

FIG. 4 is a flowchart illustrating a method (actuator control method) of driving the wavelength variable interference filter in a spectroscopic measurement process of the spectroscopic measurement apparatus 1.

In order to acquire the intensity of light of each wavelength included in the measurement target light using the spectroscopic measurement apparatus 1, first, the control unit 20 sets the wavelength (objective wavelength) of light, which passes through the wavelength variable interference filter 5, using the wavelength setting unit 21. Further, the wavelength setting unit 21 outputs the wavelength setting instruction, through which light having the set objective wavelength passes, to the filter control unit 15 (step S1).

Subsequently, the bias instruction section 162 of the micro-computer 16 sets a provisional bias voltage corresponding to the objective wavelength which is designated by the wavelength setting instruction (step S2).

More specifically, the bias instruction section 162 sets the provisional bias voltage such that sensitivity (gap displacement (m/V) for an applied voltage), which is acquired when a voltage is applied to the control actuator 58, is uniform in feedback control.

Here, the sensitivity RC (m/V), which is acquired when a voltage is applied to the control actuator 58, is expressed in Equation 1 below.

$$R_C = \frac{\{2k\varepsilon S_C d(d_{max} - d)^2 - \varepsilon^2 S_C S_b V_b^2\}^{1/2}}{k(d_{max} - d)(d_{max} - 3d)} \quad (1)$$

In Equation 1, $V_b$ indicates the provisional bias voltage which is applied to the bias actuator 57, k indicates the spring coefficient of the movable substrate 52 (holding part 522), ε indicates the permittivity between the fixed substrate 51 and the movable substrate 52 (the gap between the electrodes), Sb indicates the effective area of the bias actuator 57, Sc indicates the effective area of the control actuator 58, dmax indicates the initial amount of the gap between the electrodes, and d indicates the objective displacement of the movable part 521 (the displacement of the gap between the electrodes) which is used to cause light having the objective wavelength to pass therethrough.

In Equation 1, RC is a uniform value and a value, which is set in advance according to a fixed gain in a controller included in the feedback control unit 154 is used. In addition, when the wavelength setting instruction, in which the objective wavelength is designated, is input from the control unit 20, the micro-computer 16 can calculate the objective value of the gap G1 which is necessary to extract light having the objective wavelength from the wavelength variable interference filter 5, and can calculate an amount which displaces the movable part 521 (objective displacement d) from the objective value.

When Equation 1 is solved with regard to $V_b$, it is possible to derive subsequent Equation 2.

$$V_b = \left[\frac{k}{\varepsilon S_b}\left\{2d(d_{max} - d)^2 - \frac{kR_c^2(d_{max} - d)^2(d_{max} - 3d)^2}{\varepsilon S_c}\right\}\right]^{1/2} \quad (2)$$

Subsequently, the filter control unit 15 performs feed-forward control through the bias driving unit 152 and feedback control through the feedback control unit 154, that is, performs voltage control on the electrostatic actuator 56 of the wavelength variable interference filter 5 (step S3).

More specifically, the bias instruction section 162 calculates the provisional bias voltage $V_b$ based on the above-described Equation 2, and outputs a bias instruction to the bias driving unit 152.

When the bias driving unit 152 acquires a bias instruction value from the micro-computer 16, the bias driving unit 152 sets a bias voltage, which is applied as a feed-forward voltage, from the provisional bias voltage $V_b$ based on the vibration detected value, which is input from the vibration disturbance detection unit 151, and applies the set bias voltage to the bias actuator 57.

The feed-forward voltage is a voltage which is used to offset the disturbance vibration, and the feed-forward control unit 152A calculates the feed-forward voltage by adding and subtracting a prescribed value, which is set in advance for the detected value from the vibration disturbance detection unit 151, to and from the provisional bias voltage $V_b$ which is calculated using Equation 2.

Therefore, for example, when high-frequency disturbance vibration is added to the optical filter device 6, electrostatic attraction force is given by the bias actuator 57 such that the influence of the disturbance vibration is offset.

In addition, the feedback control is performed by the feedback control unit 154.

That is, the feedback control unit 154 calculates the deviation between the detection signal, which is input from the gap detection unit 153, and the objective instruction signal, which is input from the micro-computer 16, and applies the feed-back voltage to the control actuator 58 such that the difference therebetween is "0". Here, the feed-forward voltage (bias voltage) is usually applied as described above, and thus the vibration of the movable part 521 due to the disturbance vibration is suppressed. Therefore, when the feedback control is performed, it is possible to precisely and rapidly put the dimension of the gap G1 into a desired objective value without vibration and divergence of the movable part 521 occurring due to the disturbance vibration.

Using the driving control process as described above, light having the objective wavelength is emitted from the wavelength variable interference filter 5 and is received by the detector 11. Further, the light quantity acquisition unit 22 of the control unit 20 acquires the quantity of light having the objective wavelength based on the input signal from the detector 11.

Further, when the above-described driving control process is sequentially performed by converting the objective wavelength, it is possible to acquire the quantity of light having a plurality of wavelengths which are necessary for spectrometry. Therefore, the spectrum measurement unit 23 can perform the spectroscopic measurement process on a measurement target based on the acquired quantity of light having each of the objective wavelengths.

Operational Effect of First Embodiment

The optical module 10 of the spectroscopic measurement apparatus 1 according to the embodiment includes the optical filter device 6 and the filter control unit 15. In addition, the optical filter device 6 includes the pair of substrates 51 and 52, and the wavelength variable interference filter 5 that includes the electrostatic actuator 56 which controls the gap dimension between the substrates 51 and 52. The wavelength variable interference filter 5 is stored inside the housing 61. Further, the filter control unit 15 includes the vibration disturbance detection unit 151 that detects the disturbance vibration, and outputs the vibration detected value, which is detected by the vibration disturbance detection unit 151, to the bias driving unit 152. The bias driving unit 152 applies the feed-forward voltage based on the vibration detected value to the bias actuator 57 which is included in the electrostatic actuator 56.

Therefore, in the embodiment, when the disturbance vibration is added, the feed-forward voltage is applied to the bias actuator 57, and thus it is possible to operate the electrostatic attraction force such that the vibration of the movable part 521 due to the disturbance vibration is suppressed. Accordingly, the vibration of the movable part 521 due to the influence of the disturbance vibration is suppressed, and thus it is possible to precisely perform gap control when the feedback control is performed. That is, it is possible to cause the fluctuation in the gap dimension between the reflection films 54 and 55 to further rapidly converge, and it is possible to reduce an amount of time from when the electrostatic actuator 56 starts to be driven to when light having the objective wavelength is emitted from the wavelength variable interference filter 5. Therefore, it is possible to rapidly perform the spectroscopic measurement process in the spectroscopic measurement apparatus 1.

In the embodiment, the electrostatic actuator 56 includes the bias actuator 57 and the control actuator 58, and the feed-forward voltage according to the disturbance vibration, which is detected by the vibration disturbance detection unit 151, is applied to the bias actuator 57.

The control actuator 58 is an actuator which is used to perform the feedback control according to the gap dimension between the reflection films 54 and 55, and it is difficult to perform the feedback control when the sensitivity of the electrostatic actuator changes. In contrast, the bias actuator 57 is an actuator which is used to uniformly maintain the sensitivity of the control actuator 58 when the feedback control is performed, and can function as a coarse adjustment driving actuator. When the feed-forward voltage corresponding to the disturbance vibration is applied to the bias actuator, it is possible to suppress the change in the sensitivity of the control actuator 58 when the feedback control is performed, and thus it is possible to perform the appropriate gap control.

In the embodiment, the vibration disturbance detection unit 151 includes the sensor which detects the management state of the optical filter device 6, such as an acceleration sensor or a gyro sensor. Therefore, it is possible to easily determine the vibration state of the optical filter device 6, the magnitude of the vibration, and the like. In addition, there are many cases in which the acceleration sensor or the gyro sensor is normally provided in, for example, a mobile terminal apparatus, such as a smart phone or a tablet terminal, which includes an imaging apparatus. Therefore, it is possible to detect the disturbance vibration which is added to the optical filter device 6 by mounting the optical filter device 6 on, for example, the mobile terminal apparatus and causing a mobile terminal apparatus-side sensor to function as the vibration detection unit.

In the embodiment, the feed-forward control unit 152A sets the feed-forward voltage (bias voltage) by adding and subtracting a prescribed value, which is set in advance according to the vibration detected value of the disturbance vibration, to and from the provisional bias voltage. It is possible to easily acquire the prescribed value by storing the prescribed value in, for example, a memory or the like as table data, and it is possible to easily calculate the feed-forward voltage which is used to suppress vibration.

Second Embodiment

Subsequently, a second embodiment of the invention will be described with reference to the accompanying drawings.

In the first embodiment, the disturbance vibration is detected by the vibration disturbance detection unit 151 using the gyro sensor, the acceleration sensor, or the like, and the feed-forward voltage (bias voltage) is applied to the bias actuator 57 according to the detected value. In contrast, the second embodiment is different from the first embodiment in that the vibration of the wavelength variable interference filter 5 is detected with regard to the optical filter device 6.

Figure 5:
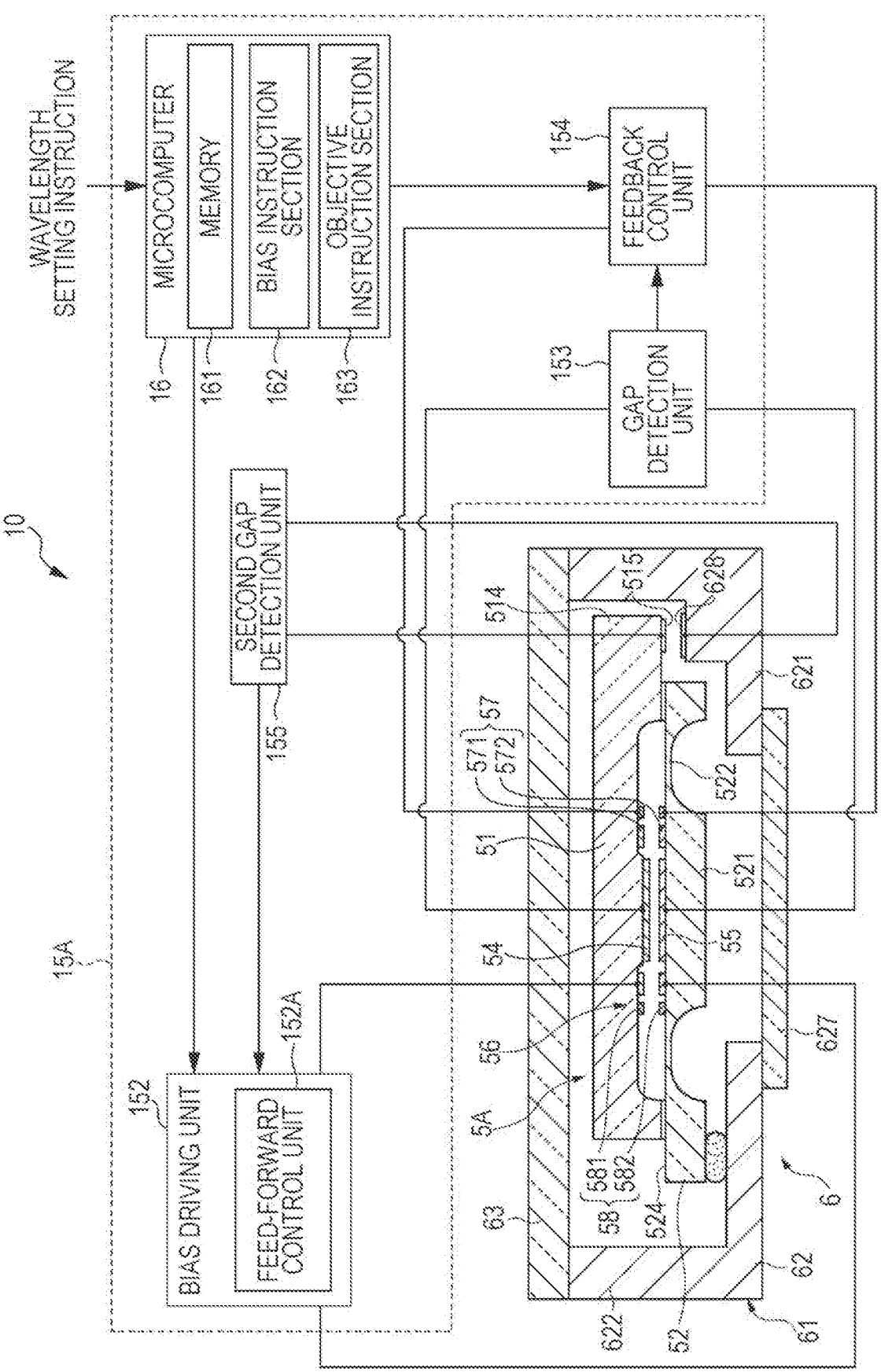
FIG. 5 is a block diagram illustrating the schematic configuration of an optical module according to a second embodiment of the invention.

FIG. 5 is a block diagram illustrating the schematic configuration of the optical module 10 according to the second embodiment.

Figure 6:
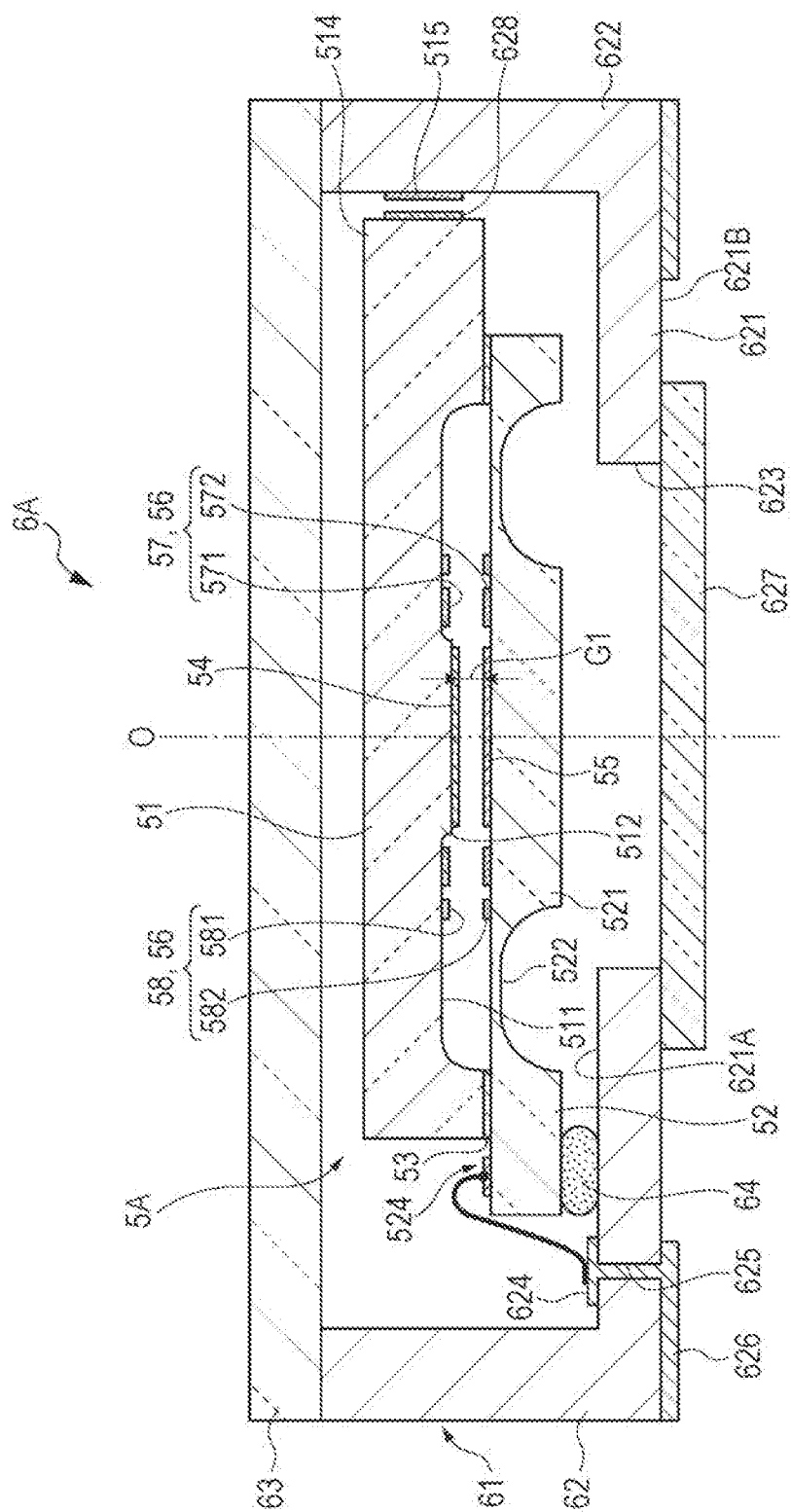
FIG. 6 is a sectional diagram illustrating the schematic configuration of the optical filter device according to the second embodiment.

FIG. 6 is a sectional diagram illustrating the schematic configuration of an optical filter device 6A according to the second embodiment.

In the embodiment, a filter-side capacity electrode 515, which is the first electrode of the invention, is provided on a surface of the protruding part 514 of the fixed substrate 51 of the wavelength variable interference filter 5, which faces the pedestal part 621, as illustrated in FIG. 6. That is, in the wavelength variable interference filter 5, the filter-side capacity electrode 515 is provided at the protruding part 514 which is on an opposite side end of one end which is fixed by the fixing member 64.

In addition, a base-side capacity electrode 628, which is the second electrode of the invention, is provided to face the filter-side capacity electrode 515 at the pedestal part 621 of the base 62, as illustrated in FIG. 6. The filter-side capacity electrode 515 and the base-side capacity electrode 628 are respectively connected to the second gap detection unit 155 in the filter control unit 15A, as illustrated in FIG. 5.

Further, the second gap detection unit 155 detects the change in the electrostatic capacity of the filter-side capacity electrode 515 and the base-side capacity electrode 628. That is, the second gap detection unit 155 detects the vibration state of the wavelength variable interference filter 5 with regard to the housing 61, and the filter-side capacity electrode 515, the base-side capacity electrode 628, and the second gap detection unit 155 form the vibration detection unit of the invention. Further, the second gap detection unit 155 outputs a voltage signal in accordance with the change in electrostatic capacity to the bias driving unit 152.

In the embodiment which is configured as described above, in step S3 of FIG. 4, the bias driving unit 152 calculates and applies the feed-forward voltage, which is used to offset the vibration of the wavelength variable interference filter 5, based on the voltage signal which is input from the second gap detection unit 155 with regard to the provisional bias voltage which is calculated based on the above-described Equation 2. That is, the feed-forward control unit 152A calculates the feed-forward voltage by adding and subtracting the prescribed value, which is set in advance to the voltage signal from the second gap detection unit 155, to and from the provisional bias voltage, and applies the feed-forward voltage to the bias actuator 57 as the bias voltage.

In the configuration of the embodiment as described above, the second gap detection unit 155 detects the change in the electrostatic capacity of the filter-side capacity electrode 515 and the base-side capacity electrode 628. Therefore, it is possible to directly detect the vibration of the wavelength variable interference filter 5 with regard to the housing 61. In this case, in addition to the disturbance vibration, which is added to the optical filter device 6 from the outside, it is possible to detect the vibration of the wavelength variable interference filter 5 due to the vibration of the movable part 521 which is generated when the electrostatic actuator 56 is driven. That is, when there is no disturbance vibration, there is a case in which the movable part 521 vibrates because the electrostatic actuator 56 is driven and the wavelength variable interference filter 5 vibrates with regard to the housing 61 due to the influence of the vibration. In the embodiment, it is possible to precisely detect such vibration. Therefore, when the bias driving unit 152 applies the bias voltage to the bias actuator 57 such that the disturbance vibration and the vibration, which is generated because the electrostatic actuator 56 is driven, are offset, it is possible to perform more precise gap control, and thus it is possible to advance the convergence of vibration when the electrostatic actuator 56 is driven. Accordingly, it is possible to further rapidly measure the quantity of light having a desired wavelength, and thus it is possible to rapidly perform a measurement process in the spectroscopic measurement process of the spectroscopic measurement apparatus 1.

In the embodiment, the side of the electric part 524 of the wavelength variable interference filter 5 is fixed to the base 62, and the filter-side capacity electrode 515 is provided at the protruding part 514 which is on a free end side on the opposite side of the fixed end.

That is, in the embodiment, the vibration state of the free end side, which is farthest from the fixed end and in which the amplitude is large in a case of vibration, is detected. Therefore, it is possible to securely detect the vibration of the wavelength variable interference filter 5 and to suppress the influence of the vibration.

In the embodiment, the filter-side capacity electrode 515 and the base-side capacity electrode 628 are included as the vibration detection unit of the invention. Therefore, the electrostatic capacity between a pair of electrodes which face each other is detected by the second gap detection unit 155, and thus it is possible to precisely detect the vibration of the wavelength variable interference filter 5 with a simple configuration.

Other Embodiments

Meanwhile, the invention is not limited to the above-described embodiments, and modifications, improvements, and the like thereof within a range, in which it is possible to accomplish the object of the invention, may be included in the invention.

Figure 7:
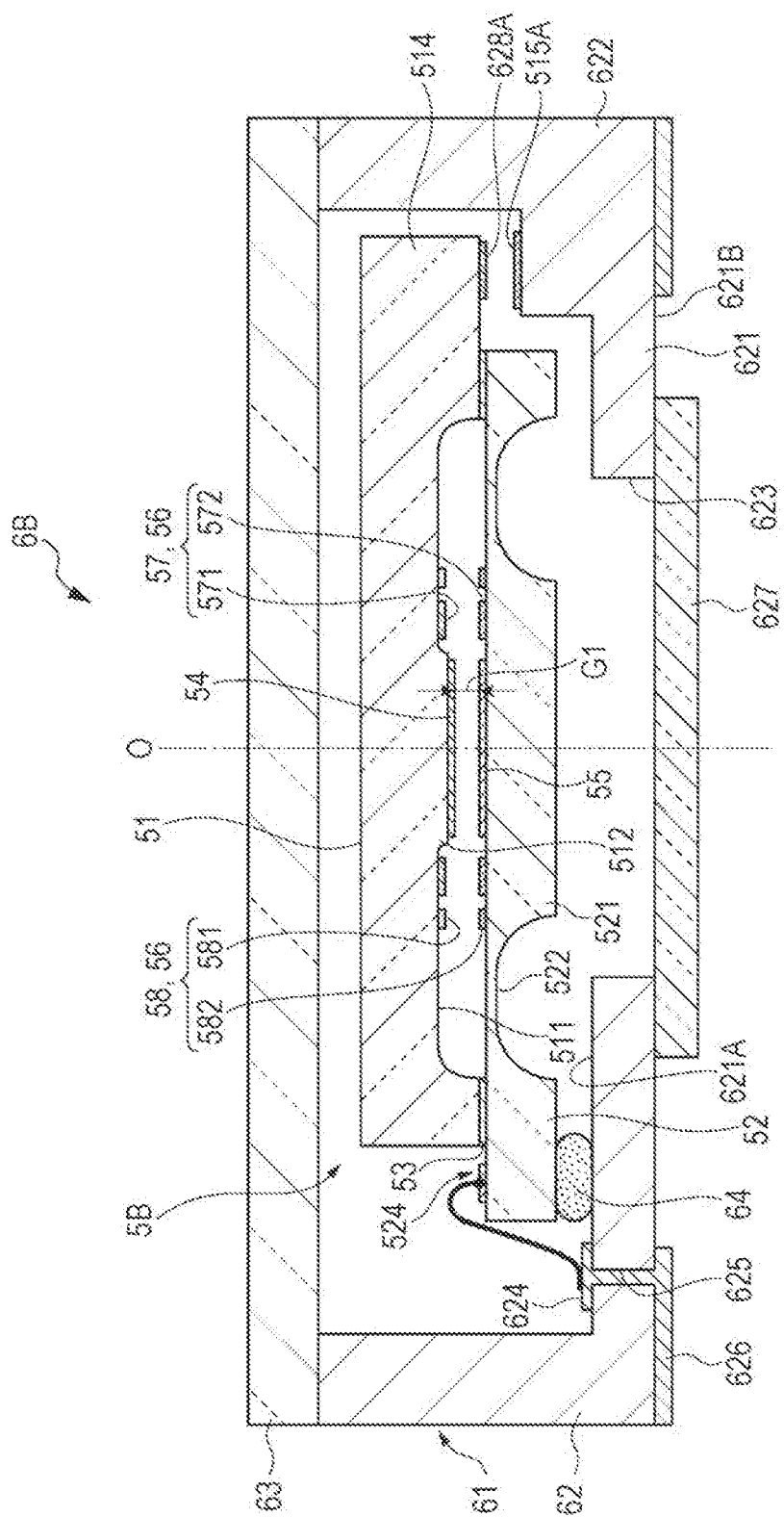
FIG. 7 is a sectional diagram illustrating the schematic configuration of an optical filter device according to another embodiment.

For example, in the second embodiment, an example is shown in which the second gap detection unit 155 detects the change in the electrostatic capacity between the filter-side capacity electrode 515, which is provided on the surface of the protruding part 514 on the side of the movable substrate 52, and the base-side capacity electrode 628. However, the invention is not limited thereto. For example, an optical filter device 6B, as illustrated in FIG. 7, may be used.

That is, a filter-side capacity electrode 515A may be provided on a side end surface of the protruding part 514, which is perpendicular to a surface in which the fixed substrate 51 and the movable substrate 52 face each other, and a base-side capacity electrode 628A may be provided in a region which faces the filter-side capacity electrode 515A. The filter-side capacity electrode 515A and the base-side capacity electrode 628A are provided having the same shape and the same size. When the wavelength variable interference filter 5A vibrates, the area between the electrodes, which face each other, changes, and thus the electrostatic capacity changes.

In the second embodiment, the gap dimension between the electrodes 515 and 628 fluctuates with regard to the vibration of the wavelength variable interference filter 5, and thus the change in the electrostatic capacity is non-linear due to the vibration. In contrast, in the configuration as illustrated in FIG. 7, the fluctuation in the gap dimension between the electrodes 515A and 628A due to the vibration is extremely small, and the change in the electrostatic capacity is linear. Therefore, it is possible to precisely detect the vibration state of the wavelength variable interference filter 5, and it is possible to more precisely set the bias voltage in order to offset the vibration.

In the second embodiment, an example is shown in which the filter-side capacity electrode 515 is provided at the protruding part 514 of the fixed substrate 51. However, the invention is not limited thereto. For example, when the protruding part 514 of the wavelength variable interference filter 5 is fixed to the base 62, the filter-side capacity electrode may be provided on the protruding part side of the movable substrate 52, which is the free end, and the base-side capacity electrode may be provided in an area which faces the filter-side capacity electrode of the base 62.

In addition, an example is shown in which the filter-side capacity electrode is provided at the free end on the opposite side of the fixed part of the base 62 of the wavelength variable interference filter 5. However, the filter-side capacity electrode may be provided in an area other than the fixed part of the base 62 of the wavelength variable interference filter 5. For example, the filter-side capacity electrode may be provided in the intermediate location between the fixed part of the base 62 of the wavelength variable interference filter 5 and the free end which is farthest from the fixed part, and the base-side capacity electrode may be provided to face the filter-side capacity electrode.

In addition, the base-side capacity electrode is provided on the base 62. However, the invention is not limited thereto. If an area faces the filter-side capacity electrode, a capacity electrode corresponding to any location within the housing 61 may be provided. For example, a filter-side capacity electrode may be provided on a side (surface which faces the lid 63) of the protruding part 514 which is opposite to the movable substrate 52, and a lid-side capacity electrode, which is the second electrode of the invention, may be provided at a part of the lid 63 which faces the filter-side capacity electrode.

Further, the filter-side capacity electrode and a housing-side capacity electrode, which faces the filter-side capacity electrode, may be provided in plural.

In the second embodiment, an example is shown in which the vibration state is detected based on the change in the electrostatic capacity between the electrodes 515 and 628. However, the invention is not limited thereto. For example, in the filter planar view of the wavelength variable interference filter 5, a laser irradiation unit which irradiates laser light and a detection unit which detects reflected laser light may be provided in locations which do not overlap with the reflection films 54 and 55, and the vibration state of the wavelength variable interference filter 5 may be detected based on the locations and intensity of the reflected laser light which is detected in the detection unit.

In each of the above embodiments, the wavelength variable interference filter 5 is described as an example of the MEMS element. However, for example, a wavelength fixing-side interference filter to which the gap dimension between the reflection films 54 and 55 is fixed may be used. When such an interference filter is used, there is a case in which the gap dimension between the reflection films fluctuates due to the disturbance vibration. In this case, the wavelength of light which is emitted from the interference filter fluctuates. In contrast, when an electrostatic actuator, which is capable of changing the distance between a pair of substrates of the interference filter, is placed and the feed-forward voltage according to the vibration detected value, which is detected by a vibration detection unit (for example, the vibration disturbance detection unit 151, the second gap detection unit 155, or the like) is applied to the electrostatic actuator, it is possible to suppress the fluctuation in the gap dimension between the reflection films due to the disturbance vibration. In this case, unlike in the embodiments, it is not necessary to include two or more actuators, such as the bias actuator 57 and the control actuator 58, as the electrostatic actuator, and a single electrostatic actuator may be provided.

In each of the above embodiments, the reflection films 54 and 55 are used as electrodes for capacity detection. However, the invention is not limited thereto. For example, electrodes for capacity detection, which face each other, may be provided on the fixed substrate 51 and the movable substrate 52, separately from the reflection films 54 and 55.

In the embodiments, the optical module 10, which controls the driving of the wavelength variable interference filter 5, is described as an example of the MEMS driving device. However, the invention is not limited thereto.

For example, the MEMS driving device can be applied to any MEMS element driving device that includes a pair of substrates which face each other and that changes the gap dimension between the pair of substrates. As such an apparatus, there is, for example, a mirror device or the like in which a mirror is placed on one side of the pair of substrates and which changes the direction of light reflected in the mirror by changing an angle with regard to a substrate (base substrate) that is another side of the substrate (mirror substrate) on which the mirror is placed. In such a mirror device, for example, a plurality of electrostatic actuators are placed between the substrates and voltages applied to the respective electrostatic actuators are changed respectively, thereby setting an inclination angle of the mirror substrate to a desired angle. In this case, when the disturbance vibration or the vibration, generated when the electrostatic actuator is driven, is added to the mirror device, it is difficult to control the gap dimension between substrates. In contrast, similarly to the embodiments, when the vibration detection unit (for example, the vibration disturbance detection unit 151, the second gap detection unit 155, or the like) of the invention is provided and vibration is offset by applying the feed-forward voltage corresponding to the detected vibration to the electrostatic actuator, it is possible to perform highly precise gap control.

In addition, in each of the above embodiments, the spectroscopic measurement apparatus 1 is described as the electronic apparatus of the invention. In addition to the spectroscopic measurement apparatus 1, it is possible to apply the wavelength variable interference filter driving method, the optical module, and the electronic apparatus of the invention in various fields.

Figure 8:
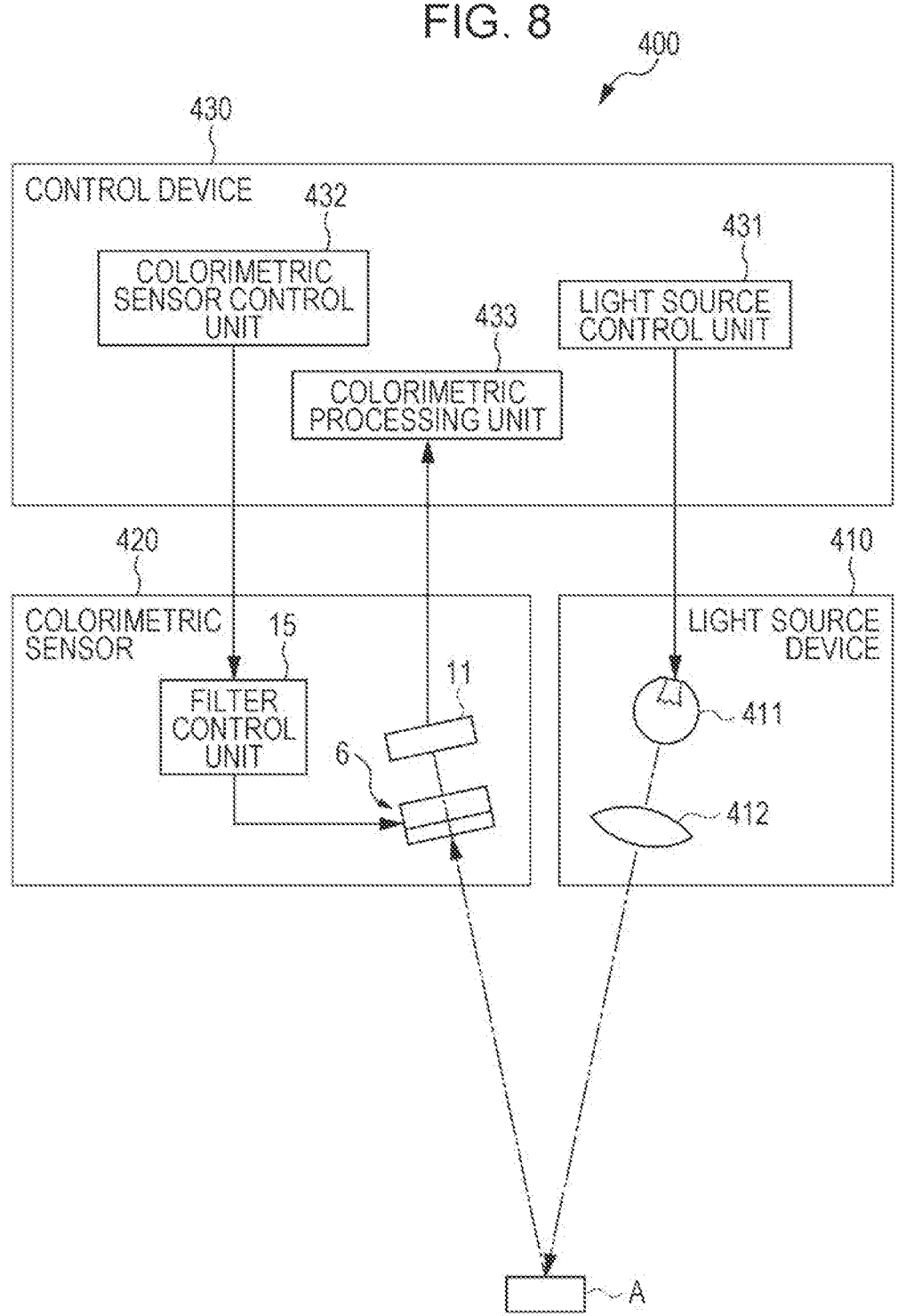
FIG. 8 is a schematic diagram illustrating a colorimetric apparatus which is an example of an electronic apparatus according to the invention.

For example, it is possible to apply the electronic apparatus of the invention to a colorimetric apparatus which measures colors, as shown in FIG. 8.

FIG. 8 is a schematic diagram illustrating an example of a colorimetric apparatus 400 which includes a wavelength variable interference filter.

As shown in FIG. 8, the colorimetric apparatus 400 includes a light source device 410 which emits light to a test target A, a colorimetric sensor 420 (optical module), and a control device 430 (processing unit) which controls the entire operation of the colorimetric apparatus 400. Further, the colorimetric apparatus 400 is an apparatus that causes light, which is emitted from the light source device 410, to be reflected in the test target A, receives reflected test target light using the colorimetric sensor 420, and analyzes and measures the chromaticity of the test target light, that is, the color or the test target A based on a detection signal which is output from the colorimetric sensor 420.

The light source device 410 includes a light source 411 and a plurality of lenses 412 (only one lens is illustrated in FIG. 8), and emits, for example, reference light (for example, white light) to the test target A. In addition, the plurality of lenses 412 may include a collimator lens. In this case, the light source device 410 causes the reference light, which is emitted from the light source 411, to be parallel light using the collimator lens, and emits the parallel light to the test target A from a projection lens which is not shown in the drawing. Further, in the embodiment, the colorimetric apparatus 400, which includes the light source device 410, is described. However, for example, when the test target A is a light emitting member, such as a liquid crystal panel, the colorimetric apparatus 400 may not include the light source device 410.

As illustrated in FIG. 8, the colorimetric sensor 420 includes an optical filter device 6 in which the wavelength variable interference filter 5 is stored, a detector 11 which receives light passing through the wavelength variable interference filter 5, and a filter control unit 15 which changes the wavelength of light passing through the wavelength variable interference filter 5. In addition, the colorimetric sensor 420 includes an incident light optical lens, which is not shown in the drawing and which guides reflected light (test target light) that is reflected in the test target A to the inside thereof, in a location which faces the wavelength variable interference filter 5. Further, the colorimetric sensor 420 spectrally separates light having a prescribed wavelength of the test target light, which is emitted from the incident optical lens, using the wavelength variable interference filter 5, and receives the spectrally separated light using the detector 11. Further, the optical filter device 6A and the filter control unit 15A may be placed instead of the optical filter device 6 and the filter control unit 15.

The control device 430 controls the entire operation of the colorimetric apparatus 400.

It is possible to use, for example, a general-purpose personal computer, a mobile information terminal, and other dedicated colorimetric computers as the control device 430. Further, as shown in FIG. 8, the control device 430 includes a light source control unit 431, a colorimetric sensor control unit 432, a colorimetric processing unit 433, and the like.

The light source control unit 431 is connected to the light source device 410, outputs a prescribed control signal to the light source device 410 based on, for example, the setting input of a user, and emits white light having prescribed brightness.

The colorimetric sensor control unit 432 is connected to the colorimetric sensor 420, sets the wavelength of light, which is received by the colorimetric sensor 420 based on, for example, the setting input of the user, and outputs a control signal to detect the quantity of light having the wavelength to the colorimetric sensor 420. The filter control unit 15 of the colorimetric sensor 420 applies a voltage to the electrostatic actuator 56 based on the control signal, and drives the wavelength variable interference filter 5.

The colorimetric processing unit 433 analyzes the chromaticity of the test target A based on the quantity of received light which is detected by the detector 11.

In addition, an optical-based system, which detects the presence of a specified material, is described as another example of the electronic apparatus of the invention. As such a system, it is possible to use a gas detection apparatus, such as a gas leak detector for a vehicle or an optoacoustic noble gas detector for expiration test, which highly sensitively detects specified gas by a spectroscopic measurement method using, for example, the wavelength variable interference filter of the invention.

An example of the gas detection apparatus will be described below with reference to the accompanying drawings.

Figure 9:
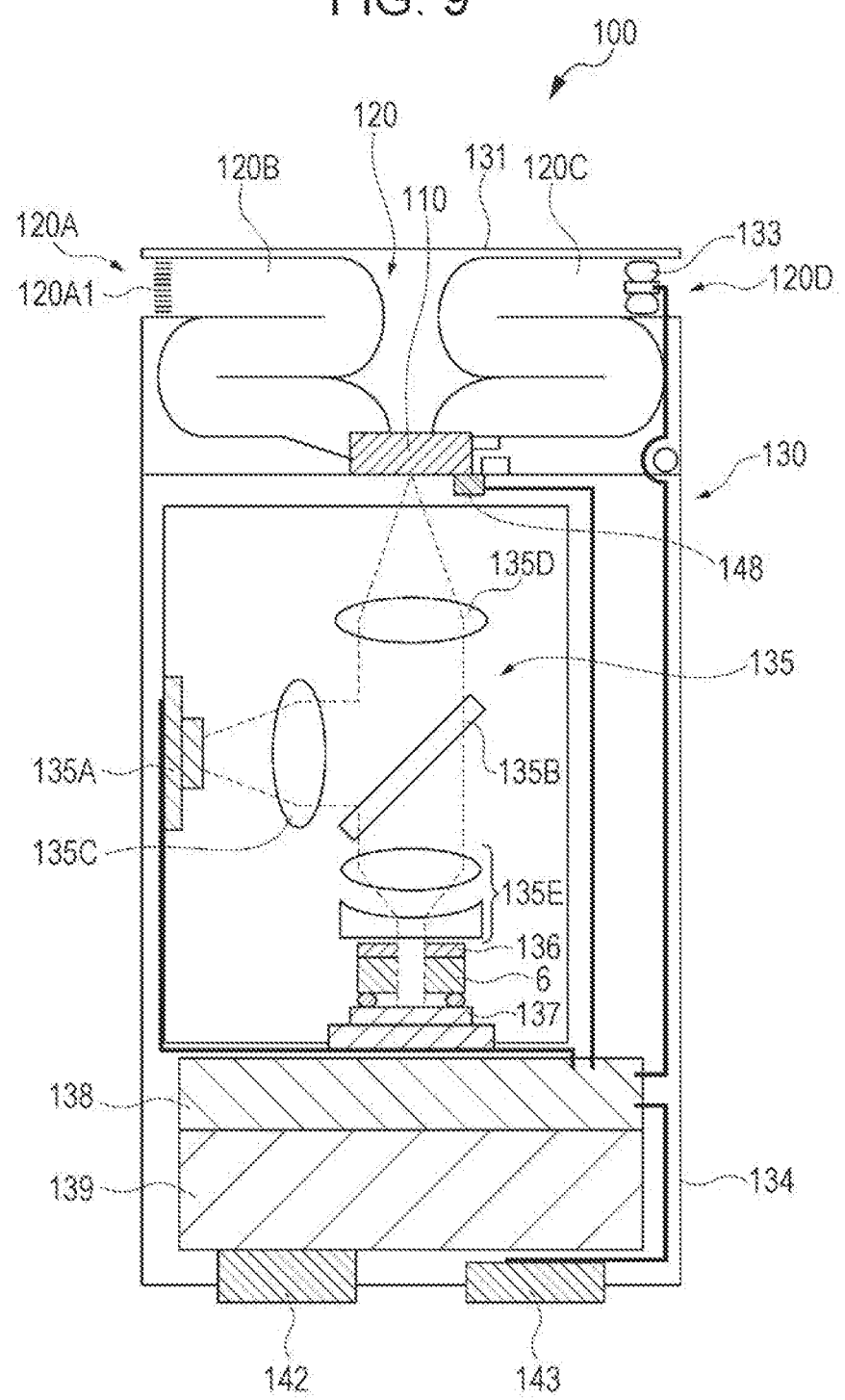
FIG. 9 is a schematic diagram illustrating a gas detection apparatus which is an example of the electronic apparatus according to the invention.

FIG. 9 is a schematic diagram illustrating an example of the gas detection apparatus using the wavelength variable interference filter.

Figure 10:
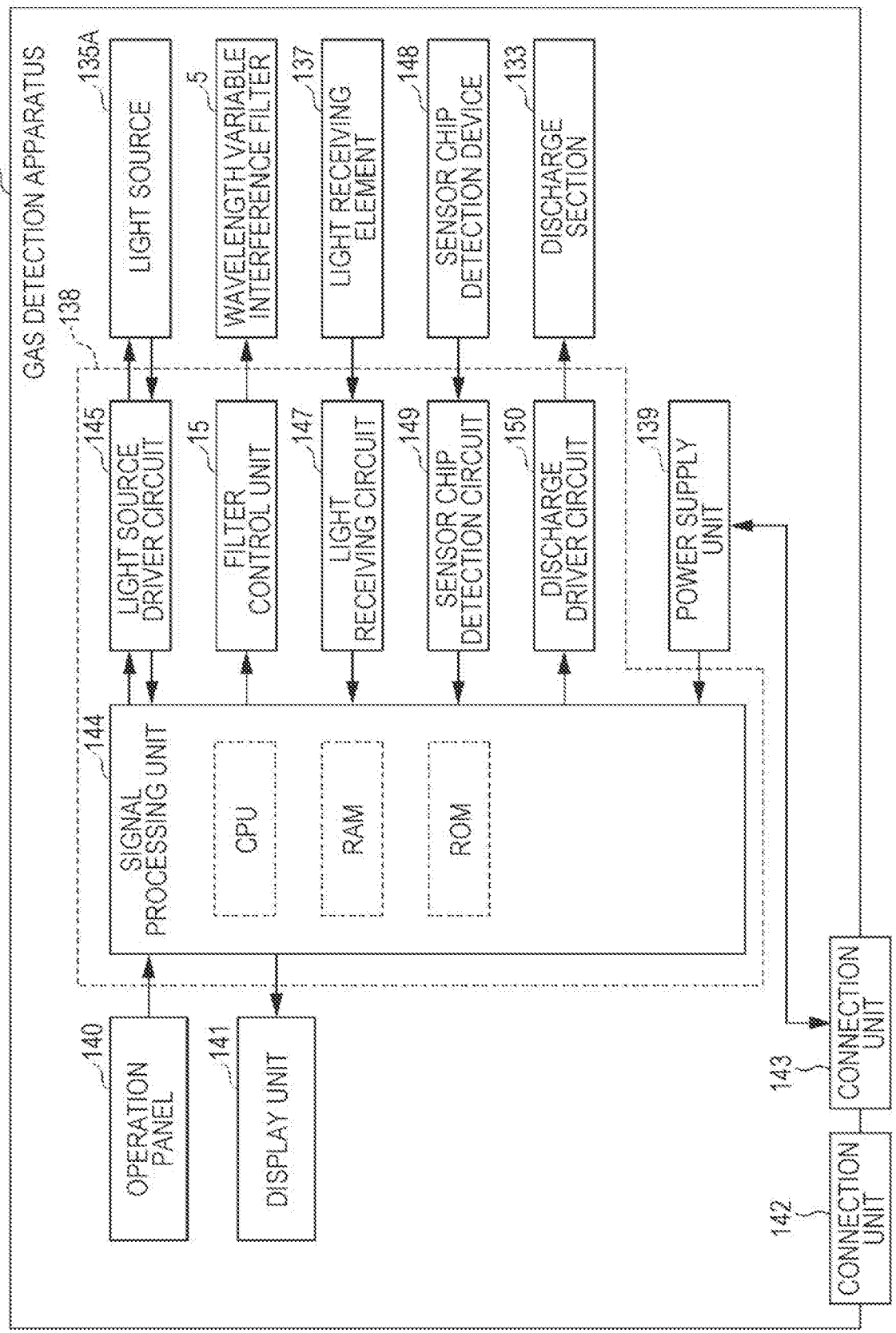
FIG. 10 is a block diagram illustrating the configuration of the control system of the gas detection apparatus of FIG. 9.

FIG. 10 is a block diagram illustrating the configuration of the control system of the gas detection apparatus of FIG. 9.

As illustrated in FIG. 9, the gas detection apparatus 100 includes a sensor chip 110, a flow passage 120 which includes a suction port 120A, a suction flow passage 120B, a discharge flow passage 120C and a discharge port 120D, and a main body part 130.

The main body part 130 includes a detector (optical module) that includes a sensor part cover 131 which has an opening causing the flow passage 120 to be detachable, a discharge section 133, a housing 134, an optical part 135, a filter 136, an optical filter device 6 and a light receiving element 137 (detection unit), a control unit 138 (processing unit) that processes a detected signal and controls the detection unit, a power supply unit 139 that supplies power, and the like. In addition, the optical part 135 includes a light source 135A which emits light, a beam splitter 135B which reflects light incident from the light source 135A in the side of the sensor chip 110 and causes light incident from the side of the sensor chip to pass through the side of the light receiving element 137, and lenses 135C, 135D, and 135E.

In addition, as illustrated in FIG. 10, an operation panel 140, a display unit 141, a connection unit 142 for interfacing with the outside, and a power supply unit 139 are provided on the surface of the gas detection apparatus 100. When the power supply unit 139 is a secondary battery, a connection unit 143 for charging electricity may be provided.

Further, as illustrated in FIG. 10, the control unit 138 of the gas detection apparatus 100 includes a signal processing unit 144 which has a CPU or the like, a light source driver circuit 145 which controls the light source 135A, a filter control unit 15 which controls the wavelength variable interference filter 5, a light receiving circuit 147 which receives a signal from the light receiving element 137, a sensor chip detection circuit 149 which reads the code of the sensor chip 110 and receives a signal from a sensor chip detector 148 which detects the presence or absence of the sensor chip 110, and a discharge driver circuit 150 which controls the discharge section 133.

Subsequently, the operation of the above-described gas detection apparatus 100 will be described below.

A sensor chip detector 148 is provided inside the sensor part cover 131 which is at the upper part of the main body part 130, and the sensor chip detector 148 detects the presence or absence of the sensor chip 110. When the signal processing unit 144 detects a detection signal from the sensor chip detector 148, the signal processing unit 144 determines a state in which the sensor chip 110 is mounted, and outputs a display signal for displaying that it is possible to perform a detection operation to the display unit 141.

Further, for example, when the operation panel 140 is operated by a user and an instruction signal for starting a detection process is output from the operation panel 140 to the signal processing unit 144, the signal processing unit 144, first, operates the light source 135A by outputting a light source operation signal to the light source driver circuit 145. When the light source 135A is driven, laser light which has a single wavelength and stable linear polarization is emitted from the light source 135A. In addition, a temperature sensor and a light quantity sensor are embedded in the light source 135A, and the information thereof is output to the signal processing unit 144. Further, when the signal processing unit 144 determines that the light source 135A is stably operated based on the temperature and the quantity of light input from the light source 135A, the signal processing unit 144 controls the discharge driver circuit 150 such that the discharge section 133 is operated. Therefore, a gas sample, which includes a target substance (gas molecule) to be detected, is introduced from the section port 120A to the suction flow passage 120B, inside the sensor chip 110, the discharge flow passage 120C, and the discharge port 120D. Meanwhile, in the section port 120A, a dust removing filter 120A1 is provided to remove relatively large dust particles, some moisture, or the like.

In addition, the sensor chip 110 is a sensor in which a plurality of metal nanostructures is incorporated and which uses localized surface plasmon resonance. In the sensor chip 110, a reinforcement electric field is formed between the metal nanostructures due to laser light, and Raman-scattering light and Rayleigh-scattering light, which contain information related to molecular vibration, are generated when the gas molecule enters the reinforcement electric field.

The Rayleigh-scattering light and the Raman-scattering light are incident into the filter 136 through the optical part 135, the Rayleigh-scattering light is separated by the filter 136, and thus the Raman-scattering light is incident into the wavelength variable interference filter 5. Further, the signal processing unit 144 outputs the control signal to the filter control unit 15. Therefore, similarly to the first embodiment, in a state in which the feed-forward voltage (bias voltage) is applied to the bias actuator 57 such that the disturbance vibration is suppressed, the filter control unit 15 applies the feed-back voltage to the control actuator 58 such that the Raman-scattering light corresponding to the gas molecule which is a detection target passes through the wavelength variable interference filter 5. Meanwhile, instead of the optical filter device 6 and the filter control unit 15, the optical filter device 6A and the filter control unit 15A may be used.

Thereafter, when the spectrally separated light is received by the light receiving element 137, a light receiving signal according to the quantity of received light is output to the signal processing unit 144 through the light receiving circuit 147. In this case, it is possible to precisely extract the Raman-scattering light, which is a target, from the wavelength variable interference filter 5.

The signal processing unit 144 compares the spectrum data of the Raman-scattering light corresponding to the gas molecule, which is the detection target acquired as described above, with data which is stored in a ROM, and determines whether or not there is an objective gas molecule, thereby specifying a substance. In addition, the signal processing unit 144 causes the display unit 141 to display the resulting information or outputs the resulting information from the connection unit 142 to the outside.

Meanwhile, in FIGS. 9 and 10, the gas detection apparatus 100 in which the Raman-scattering light is spectrally separated using the wavelength variable interference filter 5 and which performs gas detection using the Raman-scattering light which is spectrally separated, is described as an example. However, the gas detection apparatus 100 may be used as a gas detection apparatus which specifies the type of gas by detecting the unique absorbance of gas. In this case, a gas sensor, which causes gas to flow inside the sensor and detects light absorbed into the gas in incident light, is used as the optical module of the invention. Further, a gas detection apparatus which analyzes and determines gas which flows inside the sensor using such a gas sensor is used as the electronic apparatus of the invention. With this configuration, it is possible to detect the components of gas using the wavelength variable interference filter.

In addition, the invention is not limited to the above-described gas detection apparatus as a system which detects the presence of a specified substance. It is possible to describe a substance component analysis apparatus, such as a noninvasive measurement apparatus for saccharides using the near-infrared spectrum or a noninvasive measurement apparatus for information of food, a living body, and a mineral, as an example.

Hereinafter, a food analysis apparatus will be described as an example of the substance component analysis apparatus.

Figure 11:
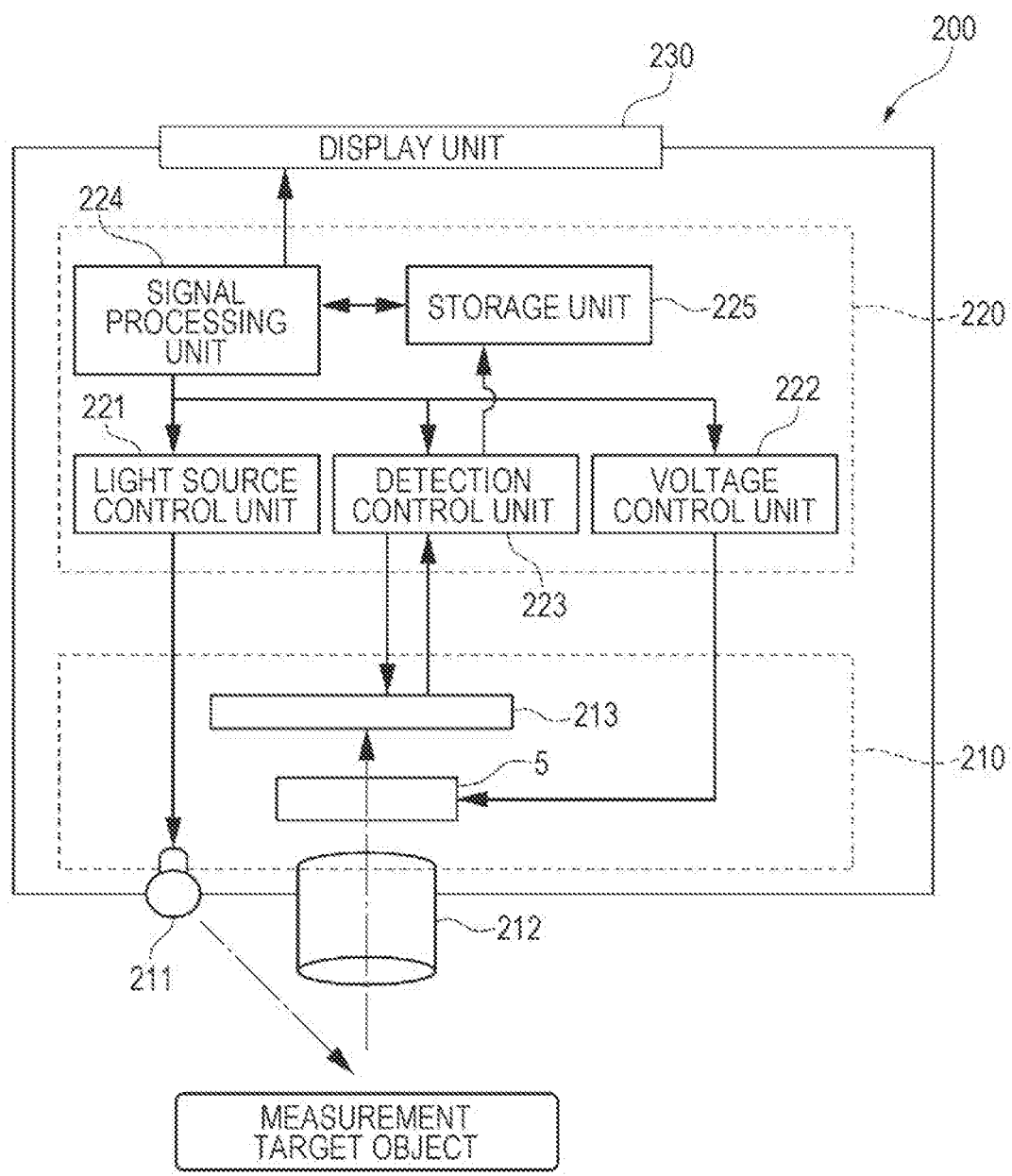
FIG. 11 is a diagram illustrating the schematic configuration of a food analysis apparatus which is an example of the electronic apparatus according to the invention.

FIG. 11 is a diagram illustrating the schematic configuration of the food analysis apparatus which is an example of the electronic apparatus using the wavelength variable interference filter 5.

As illustrated in FIG. 11, the food analysis apparatus 200 includes a detection device 210 (optical module), a control unit 220, and a display unit 230. The detection device 210 includes a light source 211 which emits light, an imaging lens 212 into which light is led from a measurement target substance, an optical filter device 6 in which the wavelength variable interference filter 5 for spectrally separating light led from the imaging lens 212 is stored, and an imaging unit 213 which detects spectrally separated light.

In addition, the control unit 220 includes a light source control unit 221 which controls the turning on/off of the light source 211 and controls brightness in a case of lighting being on, the filter control unit 15 which controls the wavelength variable interference filter 5, a detection control unit 223 which controls the imaging unit 213 and acquires a spectral image which is imaged by the imaging unit 213, a signal processing unit 224 (analyzer), and a storage unit 225.

In the food analysis apparatus 200, when a system is driven, the light source 211 is controlled by the light source control unit 221, and light is irradiated to a measurement target substance from the light source 211. Further, light, which is reflected in the measurement target substance, is incident into the wavelength variable interference filter 5 through the imaging lens 212. Therefore, it is possible to precisely extract light having an objective wavelength from the wavelength variable interference filter 5. Further, extracted light is imaged by the imaging unit 213 which includes, for example, a CCD camera or the like. In addition, imaged light is stored in the storage unit 225 as the spectral image. In addition, the signal processing unit 224 changes a voltage value, which is applied to the wavelength variable interference filter 5, by controlling the filter control unit 15, and acquires the spectral image for each wavelength.

Further, the signal processing unit 224 performs arithmetic processing on data of each pixel in each image, which is stored in the storage unit 225, and acquires a spectrum in each pixel. In addition, the storage unit 225 stores, for example, information relevant to the components of food with regard to spectrum, and the signal processing unit 224 analyzes the data of the acquired spectrum based on the information relevant to the food, which is stored in the storage unit 225, and acquires the ingredients of the food included in the detection target and the content thereof. In addition, it is possible to calculate food calories, freshness, and the like from the acquired ingredients of food and the content thereof. Further, when spectral distribution in an image is analyzed, it is possible to extract some parts of test target food in which freshness is deteriorated, and, further, it is possible to detect a foreign substance or the like included in the food.

Further, the signal processing unit 224 performs a process of causing the display unit 230 to display information related to the ingredients of food, the content thereof, the calories, the freshness, and the like of the test target which are acquired as described above.

In addition, an example of the food analysis apparatus 200 is illustrated in in FIG. 11. However, with approximately the same configuration, it is possible to use the invention as a noninvasive measurement apparatus for other information as described above. For example, it is possible to use the invention as a biological analysis apparatus which measures and analyzes body fluid components such as blood. With regard to the biological analysis apparatus, it is possible to use an apparatus, which detects ethyl alcohol as the apparatus which measures, for example, the body fluid components such as blood, as an intoxicated driving prevention device which detects the blood alcohol level of a driver. In addition, it is possible to use the invention as an electronic endoscope system which includes the biological analysis apparatus.

Further, it is possible to use the invention as a mineral analysis apparatus which analyzes the components of a mineral.

Further, it is possible to apply the wavelength variable interference filter, the optical module, and the electronic apparatus of the invention to apparatuses below.

For example, when the intensity of light having each wavelength is changed over a period of time, it is possible to transmit data using light having each wavelength. In this case, when light having a specified wavelength is spectrally separated using the wavelength variable interference filter provided in the optical module and is received using a light receiving unit, it is possible to extract the data which is transmitted using light having the specified wavelength. When the data of light having each wavelength is processed using the electronic apparatus which includes the optical module for extracting data, it is possible to perform optical communication.

In addition, it is possible to apply the electronic apparatus to a spectroscopic camera, a spectrometer, or the like which images a spectral image by spectrally separating light using the wavelength variable interference filter of the invention. An infrared camera into which the wavelength variable interference filter is built may be provided as an example of the spectroscopic camera.

Figure 12:
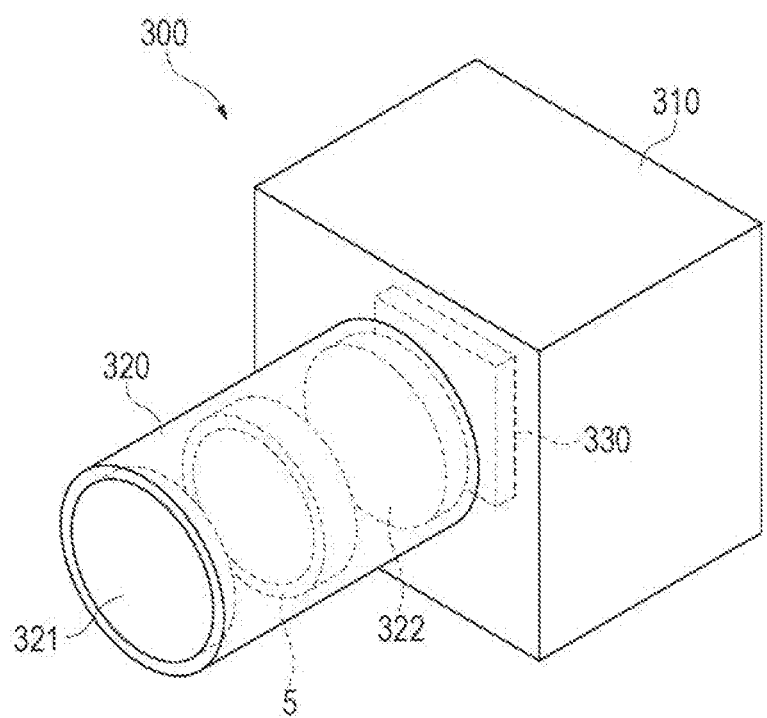
FIG. 12 is a diagram illustrating the schematic configuration of a spectroscopic camera which is an example of the electronic apparatus according to the invention.

FIG. 12 is a schematic diagram illustrating the schematic configuration of the spectroscopic camera. As illustrated in FIG. 12, the spectroscopic camera 300 includes a camera main body 310, an imaging lens unit 320, and an imaging unit 330.

The camera main body 310 is a part which is gripped and operated by a user.

The imaging lens unit 320 is provided on the camera main body 310, and guides incident image light to the imaging unit 330. In addition, as illustrated in FIG. 12, the imaging lens unit 320 includes an objective lens 321, an imaging lens 322, and an optical filter device 6 in which a wavelength variable interference filter 5 provided between the lenses is stored.

The imaging unit 330 includes a light receiving element, and images image light which is guided through the imaging lens unit 320.

In the spectroscopic camera 300, light having a wavelength which is an imaging target is passed through the wavelength variable interference filter 5, and thus it is possible to image a spectral image using light having a desired wavelength. Here, when a filter control unit (not shown in the drawing) drives the wavelength variable interference filter 5 with regard to each wavelength using the driving method of the invention as described in the first embodiment, it is possible to precisely extract image light having the objective wavelength of the spectral image.

Further, the wavelength variable interference filter of the invention may be used as a band-pass filter, and it is possible to use the wavelength variable interference filter of the invention as an optical laser apparatus which spectrally separates and transmits only narrow band light centering on a prescribed wavelength in light having a prescribed wavelength region which is emitted by, for example, a light emitting element.

In addition, the wavelength variable interference filter of the invention may be used as a biometric apparatus, and it is possible to apply the wavelength variable interference filter of the invention to an apparatus for certifying a blood vessel, a fingerprint, a retina, an iris, or the like using, for example, light in a near infrared area or a visible area.

Further, it is possible to use the optical module and the electronic apparatus as a concentration detection apparatus. In this case, infrared energy (infrared light), which is emitted from a substance, is spectrally separated and analyzed using the wavelength variable interference filter, and the concentration of a subject in a sample is measured.

As described above, it is possible to apply the wavelength variable interference filter, the optical module, and the electronic apparatus of the invention to any apparatus which spectrally separates prescribed light from the incident light. Further, as described above, in the wavelength variable interference filter of the invention, it is possible to spectrally separate a plurality of wavelengths using a single device, and thus it is possible to precisely measure the spectra of the plurality of wavelengths and detect a plurality of components. Therefore, compared to an apparatus according to the related art, which extracts a desired wavelength using a plurality of devices, it is possible to promote the miniaturization of an optical module or an electronic apparatus, and it is possible to suitably use the wavelength variable interference filter of the invention as, for example, a mobile or vehicle optical device.

In addition, a detailed structure in the implementation of the invention can be appropriately changed to another structure in a region in which it is possible to accomplish the object of the invention.

What is claimed is:

1. An MEMS driving device comprising:
an MEMS element that includes a pair of substrates and an electrostatic actuator which changes a gap dimension between the pair of substrates, wherein the electrostatic actuator includes a bias actuator and a control actuator;
a vibration detection unit that detects vibration which is added to the MEMS element; and
an actuator control unit that (i) adjusts a feed-forward voltage applied to the electrostatic actuator by adding or subtracting a prescribed value to or from a bias voltage, wherein the prescribed value is based on a detected value of the vibration detection unit, and (ii) applies a feed-back voltage to the electrostatic actuator based on the gap dimension between the pair of substrates, wherein:
the feed-back voltage is a voltage that adjusts the gap dimension between the pair of substrates during a feedback control and the feed-forward voltage is a voltage that (i) offsets vibration during the feedback control and (ii) controls a sensitivity of the control actuator based on the bias voltage, and
the actuator control unit applies the feed-forward voltage to the bias actuator and applies the feed-back voltage to the control actuator.

2. The MEMS driving device according to claim 1, further comprising:
a base substrate to which a part of the MEMS element is fixed,
wherein the vibration detection unit detects vibration of the MEMS element with regard to the base substrate.

3. The MEMS driving device according to claim 2,
wherein an end of at least one of the pair of substrates is fixed to the base substrate, and
wherein the vibration detection unit detects vibration at a free end on a side which is opposite to the end of the substrate.

4. The MEMS driving device according to claim 2,
wherein at least one of the pair of substrates includes a first electrode which faces the base substrate, wherein the base substrate includes a second electrode which faces the first electrode, and wherein the vibration detection unit detects the vibration based on an electrostatic capacity between the first electrode and the second electrode.

5. The MEMS driving device according to claim 1, wherein the MEMS element is a wavelength variable interference filter that includes a pair of reflection films which are provided on surfaces of the pair of substrates facing each other, and that selects and emits light having a prescribed wavelength from incident light which is incident to the pair of reflection films facing each other.

6. An electronic apparatus comprising:

an MEMS driving device including:
- an MEMS element that includes a pair of substrates and an electrostatic actuator which changes a gap dimension between the pair of substrates, wherein the electrostatic actuator includes a bias actuator and a control actuator;
- a vibration detection unit that detects vibration which is added to the MEMS element, and
- an actuator control unit that (i) adjusts a feed-forward voltage applied to the electrostatic actuator by adding or subtracting a prescribed value to or from a bias voltage, wherein the prescribed value is based on a detected value of the vibration detection unit, and (ii) applies a feed-back voltage to the electrostatic actuator based on the gap dimension between the pair of substrates; and a control unit that controls the MEMS driving device, wherein:

the feed-back voltage is a voltage that adjusts the gap dimension between the pair of substrates during a feedback control and the feed-forward voltage is a voltage that (i) offsets vibration during the feedback control and (ii) controls a sensitivity of the control actuator based on the bias voltage, and the actuator control unit applies the feed-forward voltage to the bias actuator and applies the feed-back voltage to the control actuator.

* * * * *